United States Patent
Kumar et al.

(10) Patent No.: US 9,896,767 B2
(45) Date of Patent: *Feb. 20, 2018

(54) LOW STRESS HARD COATINGS AND APPLICATIONS THEREOF

(71) Applicant: Kennametal Inc., Latrobe, PA (US)

(72) Inventors: Vineet Kumar, Latrobe, PA (US); Ronald Penich, Greensburg, PA (US); Yixiong Liu, Greensburg, PA (US)

(73) Assignee: KENNAMETAL INC, Latrobe, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/248,922

(22) Filed: Apr. 9, 2014

(65) Prior Publication Data
US 2015/0050490 A1 Feb. 19, 2015

Related U.S. Application Data

(63) Continuation-in-part of application No. 13/969,330, filed on Aug. 16, 2013.

(51) Int. Cl.
C23C 14/06 (2006.01)
C23C 28/04 (2006.01)
(Continued)

(52) U.S. Cl.
CPC ............ *C23C 28/042* (2013.01); *C04B 35/66* (2013.01); *C23C 14/0021* (2013.01); *C23C 14/024* (2013.01); *C23C 14/0641* (2013.01); *C23C 14/325* (2013.01); *C23C 28/044* (2013.01); *C23C 28/42* (2013.01); *H01J 37/32055* (2013.01); *H01J 37/32568* (2013.01); *H01J 37/32614* (2013.01); *H01J 37/32669* (2013.01);
(Continued)

(58) Field of Classification Search
USPC .................. 407/119; 428/336, 697, 698, 699; 51/307, 309
See application file for complete search history.

(56) References Cited

U.S. PATENT DOCUMENTS 5,296,016 A 3/1994 Yoshimura
5,712,030 A 1/1998 Goto et al.
(Continued)

FOREIGN PATENT DOCUMENTS

CN 1276024 A 12/2000
CN 1316545 A 10/2001
(Continued)

OTHER PUBLICATIONS

K-4313USUS1—Non-Final Rejection dated Nov. 20, 2014.
(Continued)

Primary Examiner — A. T.
(74) Attorney, Agent, or Firm — Larry R. Meenan

(57) ABSTRACT

In one aspect, coated cutting tools are described herein comprising a substrate and a coating comprising a refractory layer deposited by physical vapor deposition adhered to the substrate, the refractory layer comprising $M_{1-x}Al_xN$ wherein $x \geq 0.68$ and M is titanium, chromium or zirconium, the refractory layer including a cubic crystalline phase and having hardness of at least 25 GPa.

32 Claims, 11 Drawing Sheets

(51) Int. Cl.
  *C04B 35/66* (2006.01)
  *H01J 37/32* (2006.01)
  *C23C 14/00* (2006.01)
  *C23C 14/02* (2006.01)
  *C23C 14/32* (2006.01)
  *C23C 28/00* (2006.01)

(52) U.S. Cl.
  CPC . *C04B 2235/3886* (2013.01); *H01J 2237/332* (2013.01); *Y10T 428/265* (2015.01); *Y10T 428/31678* (2015.04)

(56) References Cited

U.S. PATENT DOCUMENTS

| | | |
|---|---|---|
| 6,033,734 A | 3/2000 | Muenz et al. |
| 6,040,012 A | 3/2000 | Anderbouhr et al. |
| 6,071,560 A | 6/2000 | Braendle et al. |
| 6,077,596 A | 6/2000 | Hashimoto et al. |
| 6,103,357 A | 8/2000 | Selinder et al. |
| 6,110,571 A | 8/2000 | Yaginuma et al. |
| 6,250,855 B1 | 6/2001 | Persson et al. |
| 6,274,249 B1 | 8/2001 | Braendle et al. |
| 6,333,099 B1 | 12/2001 | Strondl et al. |
| 6,382,951 B1 | 5/2002 | Soderberg et al. |
| 6,395,379 B1 | 5/2002 | Braendle |
| 6,558,749 B2 | 5/2003 | Braendle |
| 6,565,957 B2 | 5/2003 | Nakamura et al. |
| 6,572,991 B1 | 6/2003 | Ruppi |
| 6,586,122 B2 | 7/2003 | Ishikawa et al. |
| 6,599,062 B1 | 7/2003 | Oles et al. |
| 6,660,133 B2 | 12/2003 | Penich et al. |
| 6,663,755 B2 | 12/2003 | Gorokhovsky |
| 6,669,747 B2 | 12/2003 | Salmon |
| 6,688,817 B2 | 2/2004 | Borschert et al. |
| 6,737,178 B2 | 5/2004 | Ota et al. |
| 6,811,581 B2 | 11/2004 | Yamada et al. |
| 6,824,601 B2 | 11/2004 | Yamamoto et al. |
| 6,838,151 B2 | 1/2005 | Kato |
| 6,844,069 B2 | 1/2005 | Braendle et al. |
| 6,866,921 B2 | 3/2005 | Grab et al. |
| 6,924,454 B2 | 8/2005 | Massa et al. |
| 7,018,726 B2 | 3/2006 | Usami et al. |
| 7,056,602 B2 | 6/2006 | Horling et al. |
| 7,083,868 B2 | 8/2006 | Horling et al. |
| 7,094,479 B2 | 8/2006 | Sato et al. |
| 7,169,485 B2 | 1/2007 | Kohara et al. |
| 7,188,463 B2 | 3/2007 | Schuller et al. |
| 7,348,074 B2 | 3/2008 | Derflinger |
| 7,410,707 B2 | 8/2008 | Fukui et al. |
| 7,431,988 B2 | 10/2008 | Hanyu et al. |
| 7,510,608 B2 * | 3/2009 | Yamamoto .......... C23C 14/0664 106/287.17 |
| 7,510,761 B2 | 3/2009 | Kondo et al. |
| 7,524,569 B2 | 4/2009 | Okamura et al. |
| 7,537,822 B2 | 5/2009 | Ishikawa |
| 7,592,076 B2 | 9/2009 | Flink et al. |
| 7,597,951 B2 | 10/2009 | Bjormander et al. |
| 7,767,319 B2 | 8/2010 | .ANG.kesson et al. |
| 7,767,320 B2 | 8/2010 | Endler |
| 7,838,132 B2 | 11/2010 | Ahlgren et al. |
| 8,025,956 B2 | 9/2011 | Yamamoto et al. |
| 8,034,438 B2 | 10/2011 | Sundstrom et al. |
| 8,071,211 B2 * | 12/2011 | Koike ................. C23C 14/0641 428/697 |
| 8,084,148 B2 | 12/2011 | Larsson et al. |
| 8,216,702 B2 | 7/2012 | Johansson |
| 8,227,098 B2 | 7/2012 | Astrand |
| 8,277,958 B2 | 10/2012 | Ni et al. |
| 8,389,134 B2 | 3/2013 | Van Den Berg et al. |
| 8,394,513 B2 | 3/2013 | Van Den Berg et al. |
| 8,409,696 B2 | 4/2013 | Johansson et al. |
| 8,409,702 B2 | 4/2013 | Ni et al. |
| 2002/0136933 A1 | 9/2002 | Braendle |
| 2004/0115484 A1 | 6/2004 | Horling et al. |
| 2006/0154051 A1 | 7/2006 | Ahlgren |
| 2006/0219325 A1 | 10/2006 | Kohara |
| 2006/0222893 A1 | 10/2006 | Derflinger |
| 2006/0257562 A1 | 11/2006 | Tamagaki et al. |
| 2007/0059558 A1 | 3/2007 | Schier |
| 2007/0148496 A1 | 6/2007 | Takaoka et al. |
| 2007/0172694 A1 | 7/2007 | Yamamoto |
| 2007/0275179 A1 | 11/2007 | Strand et al. |
| 2007/0292671 A1 | 12/2007 | Akesson et al. |
| 2007/0298280 A1 | 12/2007 | Omori |
| 2008/0286608 A1 | 11/2008 | Quinto et al. |
| 2008/0299383 A1 | 12/2008 | Martensson et al. |
| 2009/0075114 A1 | 3/2009 | Hovsepian et al. |
| 2009/0098372 A1 | 4/2009 | Ishii et al. |
| 2009/0123779 A1 | 5/2009 | Endler |
| 2009/0130434 A1 | 5/2009 | Zhu et al. |
| 2009/0297835 A1 | 12/2009 | Okada et al. |
| 2010/0062257 A1 | 3/2010 | Morstein et al. |
| 2011/0020079 A1 | 1/2011 | Tabersky et al. |
| 2011/0081539 A1 | 4/2011 | Ni |
| 2011/0111197 A1 | 5/2011 | Johansson et al. |
| 2012/0201615 A1 | 8/2012 | Ni et al. |
| 2015/0211105 A1 * | 7/2015 | Schier .................. C23C 14/0641 428/336 |
| 2015/0232978 A1 * | 8/2015 | Schier .................. C23C 14/0641 428/216 |

FOREIGN PATENT DOCUMENTS

| | | |
|---|---|---|
| CN | 101035674 A | 9/2007 |
| CN | 102378657 A | 3/2012 |
| DE | 102006047414 A1 | 8/2007 |
| DE | 102012107129 A1 | 2/2014 |
| DE | 102012109254 A1 | 4/2014 |
| EP | 0899359 A1 | 3/1999 |
| EP | 0492059 B1 | 7/2000 |
| EP | 0558061 B1 | 8/2000 |
| EP | 0801144 B1 | 5/2001 |
| EP | 1122334 A1 | 8/2001 |
| EP | 0709353 B1 | 6/2002 |
| EP | 0885984 B1 | 7/2002 |
| EP | 1219723 | 7/2002 |
| EP | 1017870 B1 | 10/2002 |
| EP | 1021584 B1 | 11/2003 |
| EP | 1087026 B1 | 11/2003 |
| EP | 1038989 B1 | 6/2004 |
| EP | 1452621 A3 | 9/2004 |
| EP | 1122226 B1 | 3/2006 |
| EP | 1683875 A2 | 7/2006 |
| EP | 1690959 A2 | 8/2006 |
| EP | 1099003 B1 | 9/2006 |
| EP | 1698714 A2 | 9/2006 |
| EP | 1702997 A2 | 9/2006 |
| EP | 1726686 A1 | 11/2006 |
| EP | 1736565 A1 | 12/2006 |
| EP | 1757389 A1 | 2/2007 |
| EP | 1825943 A1 | 8/2007 |
| EP | 1674597 B1 | 1/2008 |
| EP | 2636764 A1 | 9/2013 |
| JP | 06136514 A | 5/1994 |
| JP | 08-209333 | 8/1996 |
| JP | 09-300106 | 11/1997 |
| JP | 2001-234328 | 8/2001 |
| JP | 2002-003284 | 1/2002 |
| JP | 2002187004 A | 7/2002 |
| JP | 2002263941 A | 9/2002 |
| JP | 2003-0127003 | 5/2003 |
| JP | 2003-136302 | 5/2003 |
| JP | 2003-175405 A | 6/2003 |
| JP | 2006-152321 A | 6/2006 |
| JP | 2006-181706 A | 7/2006 |
| JP | 2007229919 A | 9/2007 |
| JP | 2008162008 A | 7/2008 |
| JP | 2008188689 A | 8/2008 |
| JP | 2010031321 A | 2/2010 |
| WO | 0070120 A1 | 11/2000 |
| WO | 03085152 A2 | 10/2003 |
| WO | 2005111257 A2 | 11/2005 |
| WO | 2006041366 A1 | 4/2006 |

(56) References Cited

FOREIGN PATENT DOCUMENTS

| WO | 2006080888 A1 | 8/2006 |
|---|---|---|
| WO | 2007003648 A1 | 1/2007 |
| WO | 2007089216 A1 | 8/2007 |
| WO | 2008037556 A2 | 4/2008 |
| WO | 2008059896 A1 | 5/2008 |
| WO | 2009031958 A1 | 3/2009 |
| WO | 2009127344 A1 | 10/2009 |
| WO | 2009151386 A8 | 12/2009 |
| WO | 2013045039 A2 | 4/2013 |

OTHER PUBLICATIONS

Rauch, J.Y., et al., "Structure and Compositions of TixAl1-xN Thin Films Sputter Deposited Using a Composite Metallic Target," Surface and Coatings Technology 157 (2002) pp. 138-143.

Ahlgren, M., et al., "Influence of Bias Variation on Residual Stress and Texture in TiAlN PVD Coatings," Surface & Coatings Technology 200 (2005) pp. 157-160.

ISA/KR, PCT Written Opinion and International Search Report for PCT/US2010/047457 (mailed May 2, 2011).

PalDey et al., "Single layer and Multilayer Wear Resistant Coatings of (Ti, Al)N: A Review," Mat. Sci. Engineer., A342 (2003) 58-79.

Musil et al., "Superhard Nanocomposite Ti1-xAlxN Films Prepared by Magnetron Sputtering," Thin Solid Films 365 (2000) 104-109.

Horling et al., "Mechanical Properties and Machining Performance of Ti1-xAlxN-Coated Cutting Tools," Surface & Coating Tech. 191 (2005) 384-392.

Hakansson et al., "Microstructure and Phys. Prop. of Polycrystalline Metastable Ti0.5Al0.5N alloys Grown by D.C. Magnetron Sputter Dep.," Thin Solid Films 191 (1987) 55-65.

Huang et al., "Dep. of (Ti,Al)N films on A2 Tool Steel by Reactive R.F. Magnetron Sputtering," Surface and Coatings Tech. 71 (1995) 259-266.

Arndt et al., "Performance of New AlTiN Coatings in Dry and High Speed Cutting," Surface and Coatings Tech. 163-164 (2003) 674-680.

Cremer et al., "Optimization of (Ti,Al)N Hard Coat. by a combinatorial Appr." Int. J. Inorganic Mat. 3 (2001) 1181-1184.

Suzuki et al., "Microstructure of Grain Boundaries of (Ti,Al)N Films," Surface and Coatings Tech. 107 (1998) 41-47.

Endrino et at., "Hard AlTiN, AlCrN PVD Coatings for Machining of Austenitic Stainless Steel," Surface and Coatings Tech. 200 (1986) 6840-6845.

Munz, "Titanium Aluminum Nitride Films: A New Alternative to TiN Coatings," J. Vacuum Sci. Tech. A 4(6) (1986) 2717-2725.

Zhou et al., "Phase Transition and Properties of Ti-Al-N Thin Films Prepared by R. F.-Plasma Assisted Magnetron Sputtering," Thin Solid Films 339 (1999) 203-208.

Tanaka et al., "Properties of (Ti1-xAlx)N coatings for Cutting Tools Prepared by the Cathodic Arc Ion Plating Method," J. Vacuum Sci. Tech. A 10(4) (1992) 1749-1756.

Horling et al., "Thermal Stability of Arc Evaporated high Aluminum-Content Ti1-xAlxN Thin Films," J. Vacuum Sci. Tech. A 20(5) (2002) 1815-1823.

Ikeda et al., "Phase Formation and Characterization of Hard Coatings in the Ti-Al-N System Prepared by the Cathodic Arc Ion Plating Method," Thin Solid Films 195 (1991) 99-110.

Kimura et al., "Metastable (Ti1-xAlx)N Films with Different Al Content," J. Mat. Sci. Letters 19 (2000) 601-602.

Cremer et al., "Exp. Determination of Metastable (Ti, Al)N Phase Diagram up to 700C," Val. Addition Metallurgy, Cho & Sohn, Editors, the Min. Metals, & Mat. Soc (1998) 249-258.

Endler et al Novel aluminum-rich T(1-x)Al(x)N coatings by LPCVD. Surface & Coatings Techn 203 (2008) p. 530-533.

Fox-Rabinovich et al "Effect of temperature of annealing below 900 C on structure, properties and tool life of an AlTiN coating under various cutting conditions". Surface & Coatings Techn 202 (2008) p. 2985-2992.

Aperador et al "Bilayer period effect on corrosion-erosion resistance for [TiN/AlTiN]n multilayered growth on AISI 1045 steel". Journal of Physics and Chemistry of Solids 71 (2010) 1754-1759.

Kutchej et al Structure, mechanical and tribological properties of sputtered Ti(1-x)Al(x)N coatings with $0.5 \leq x = <0.75$. Surface & Coatings Techn 200 (2005) p. 2358-2365.

Santana et al "The role of hcp-AlN on hardness behavior of Ti(1-x)Al(x)N nanpocomposite during annealing" ThinSolid Films 469-470 (2004) p. 399-344.

Mayrhofer et al, Influence of the Al distribution on the structure, elastic properties, and phase stability of supersaturated Ti1-xAlxN, Journal of Applied Physics, 2006, pp. 6-10, vol. 100, 094906, American Institute of Physics.

Shimada et al, Preparation of (Ti1-xAlx)N films from mixed alkoxide solutions by plasma CVD, Thin Solid Films, 2000, vol. 370, pp. 146-150, Elsevier.

Kim et al, High temperature oxidation of (Ti1-xAlx)N coatings made by plasma enhanced chemical vapor disposition, J. Vac. Sci. Technol, A, Jan./Feb. 1999, pp. 133-137, vol. 17, No. 1.

Sproul, William D., Physical vapor deposition tool coatings, Surface and Coatings Technology, 1996, pp. 1-7, vol. 81.

Lee et al., (Ti1-xAlx)N coatings by plasma-enhanced chemical vapor deposition, J. Vac. Sci. Technol. A, Jul./Aug. 1994, pp. 1602-1607, vol. 12, No. 4.

Weber et al "Cathodic arc evaporation of (Ti,Al)N coatings and (Ti,Al)N/TiN multilayer-coatings-correlation between lifetime pf coated cutting tool, structural and mechanical film properties" Surface & Coatings Tech. 177-178, (2004) p. 227-232.

Derflinger et al., Mechanical and structural properties of various alloyed TiAlN-based hard coatings, Surface Coatings & Technology, 2006, pp. 4693-4700, vol. 200, Elsevier B.V.

Bobzin et al., Grain size evaluation of pulsed TiAlN nanocomposite coatings for cutting tools, Thin Solid Films, 2007, pp. 3681-3684, vol. 515, Elsevier B.V.

G. Abadias, Stress and preferred orientation in nitride-based PVD coatings, Surface Coatings & Technology, 2008, pp. 2223-2235, vol. 202, Elsevier B.V.

Search Report for GB1202134.1 dated May 31, 2012; 2 pgs.

Search Report for GB 1414590.8 dated Feb. 25, 2015, 7 pages.

Apr. 9, 2015 Office action (3 months) 2 20150050489.

Jul. 21, 2015 Notice of Allowance 20150050489-K-04313-US-NP.

Quinto, D. T., et al., Mechanical Properties, Structure and Performance of Chemically Vapor-Deposited and Physically Vapor-Deposited Coated Carbide Tools, Materials Science and Engineering, 1988, pp. 443-452.

K-04313-DE-NP German Office Action dated Aug. 30, 2016, 7 pages.

Blasek, G. et al., Vakuum Plasma Technologien—Beschichtung und Modifizierung von Oberflachen. Teil I. Bad Saulgau: Eugen G. Leuze Verlag KG, 2010, p. 231.

K-04313-DE-NP Translation of German Office Action dated Aug. 30, 2016, 7 pages.

Kimura, Ayako et al, Anisotropic lattice expansion and shrinkage of hexagonal TiAlN and CrAlN films, Surface and Coatings Technology 169-170 (2003), pages 367-370.

Chinese Office Action dated Aug. 1, 2017 in Chinese patent application No. 201410401183.8, 19 pages.

* cited by examiner

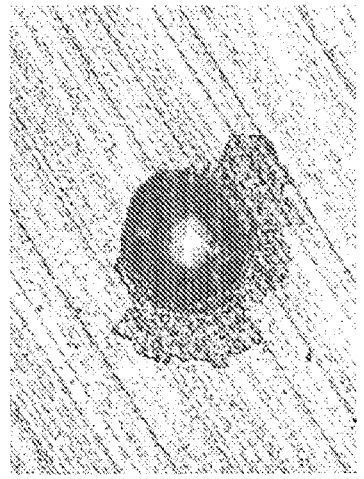
PVD IMAGE: FLAKING
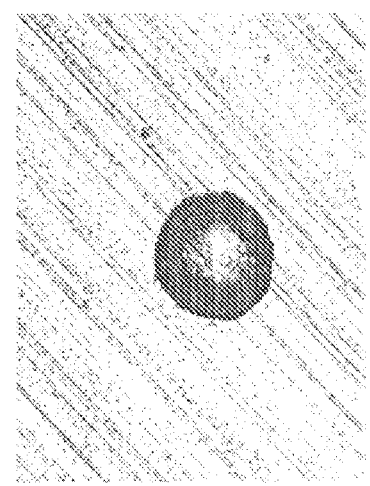
PVD IMAGE: NO FLAKING
FIGURE 9

LOW STRESS HARD COATINGS AND APPLICATIONS THEREOF

RELATED APPLICATION DATA

The present application is a continuation-in-part of U.S. patent application Ser. No. 13/969,330 filed Aug. 16, 2013, which is incorporated herein by reference in its entirety.

FIELD

The present invention relates to hard refractory coatings for cutting tools and wear parts and, in particular, to refractory coatings deposited by physical vapor deposition demonstrating high thickness, high hardness and low stress.

BACKGROUND

One or more layers of refractory material are often applied to cutting tool surfaces by physical vapor deposition (PVD) techniques to increase properties including wear resistance, performance and lifetime of the cutting tool. Titanium nitride (TiN) coatings, for example, are commonly applied by PVD to cemented carbide cutting tool substrates. However, TiN begins oxidation at about 500° C. forming rutile $TiO_2$, thereby promoting rapid coating deterioration. Incorporation of aluminum into the cubic lattice can slow degradative oxidation of a TiN coating by forming a protective aluminum-rich oxide film at the coating surface.

While providing enhancement to high temperature stability, aluminum can also induce structural changes in a TiN coating having a negative impact on coating performance. Increasing amounts of aluminum incorporated into a TiN coating can induce growth of hexagonal close packed (hcp) aluminum nitride (AlN) phase, altering the crystalline structure of the coating from single phase cubic to a mixture of cubic and hexagonal phases. Aluminum content in excess of 70 atomic percent can further alter the crystalline structure of the AlTiN layer to single phase hcp. Significant amounts of hexagonal phase can lead to a considerable reduction in hardness of AlTiN, resulting in premature coating failure or other undesirable performance characteristics. The inability to sufficiently control hexagonal phase formation has obstructed full realization of the advantages offered by aluminum additions to TiN coatings.

Further, PVD coatings, including AlTiN, are limited in thickness due to high residual compressive stresses induced by ion bombardment during the deposition process. Residual compressive stress only increases with coating thickness rendering the coating susceptible to delamination or other adhesive failure modes. Bias voltage of the substrate can be reduced to mitigate residual compressive stress in PVD coatings. Nevertheless, reduction in bias voltages can significantly compromise coating hardness. For example, in AlTiN and similar systems, reduction in bias voltage promotes hexagonal phase formation.

In view of these considerations, significant barriers exist to providing PVD coatings of AlTiN having high aluminum content, high hardness, high thickness and/or low residual compressive stress.

SUMMARY

In one aspect, solutions to the forgoing barriers are addressed herein to provide cutting tools and wear parts PVD coatings having high aluminum content, high hardness, high thickness and/or low residual compressive stress. For example, a coated cutting tool described herein, in some embodiments, comprises a substrate and a refractory layer deposited by PVD adhered to the substrate, the refractory layer comprising $M_{1-x}Al_xN$ wherein x≥0.4 and M is titanium, chromium or zirconium, the refractory layer having a thickness greater than 5 μm, hardness of at least 25 GPa and residual compressive stress less than 2.5 GPa. Further, the refractory layer can have hexagonal phase content greater than 15 weight percent and up to 35 weight percent. As described further herein, the refractory layer comprising $M_{1-x}Al_xN$ can be a single, monolithic layer or can be formed of a plurality of sublayers.

In another aspect, a coated cutting tool described herein comprises a substrate and a coating comprising a refractory layer deposited by physical vapor deposition adhered to the substrate, the refractory layer comprising $M_{1-x}Al_xN$ wherein x≥0.68 and M is titanium, chromium or zirconium, the refractory layer including a cubic crystalline phase and having hardness of at least 25 GPa.

In another aspect, methods of making coated cutting tools are described herein. A method of making a coated cutting tool, in some embodiments, comprises providing a substrate and depositing over a surface of the cutting tool substrate by cathodic arc deposition a coating comprising a refractory layer including $M_{1-x}Al_xN$ wherein x≥0.4 and M is titanium, chromium or zirconium, the refractory layer having a thickness greater than 5 μm, a hardness of at least 25 GPa and a residual compressive stress less than 2.5 GPa. In some embodiments, at least a portion of the refractory layer is deposited at a bias of less than −40 V. For example, the bias can be in the range of −20 V to less than −40 V.

In another embodiment, a method of making a coated cutting tool comprises providing a cutting tool substrate and depositing a coating over a surface of the substrate, the coating comprising a refractory layer including $M_{1-x}Al_xN$ wherein x≥0.64 and M is titanium, chromium or zirconium, the refractory layer having hardness of at least 25 GPa, wherein the refractory layer is deposited with a cathodic arc deposition apparatus comprising at least one anode having an annular extension.

In a further aspect, methods of making coated cutting tools described herein can limit or control hexagonal phase formation in the deposited refractory layer. In some embodiments, a method of making a coated cutting tool comprises providing a substrate and depositing over a surface of the substrate by cathodic arc deposition a coating comprising a refractory layer of $M_{1-x}Al_xN$ wherein x≥0.4 and M is titanium, chromium or zirconium, wherein at least a portion of the refractory layer is deposited at a bias of less than −40 V and hexagonal phase is limited in the refractory layer to 0-35 weight percent by using at least one cathode target having a diameter less than about 80 mm.

Moreover, a method of making a coated cutting tool comprises providing a substrate and depositing over a surface of the substrate by cathodic arc deposition a coating comprising a refractory layer of $M_{1-x}Al_xN$ wherein x≥0.4 and M is titanium, chromium or zirconium, wherein at least a portion of the refractory layer is deposited at a bias of less than −40 V and hexagonal phase is limited in the refractory layer to 0-35 weight percent by reducing magnitude of one or more arc steering magnetic fields.

Further, a method of making a coated cutting tool comprises providing a substrate and depositing over a surface of the substrate by cathodic arc deposition a coating comprising a refractory layer including $M_{1-x}Al_xN$ wherein x≥0.4 and M is titanium, chromium, zirconium or zirconium, wherein at least a portion of the refractory layer is deposited at a bias of less than −40 V and hexagonal phase is limited in the refractory layer to 0-35 weight percent by depositing the refractory layer as a plurality of sublayer groups, a sublayer group comprising a cubic phase forming nanolayer and adjacent nanolayer of the $M_{1-x}Al_xN$.

Additionally, a method of making a coated cutting tool comprises providing a substrate and depositing over a surface of the substrate by cathodic arc deposition a coating comprising a refractory layer of $M_{1-x}Al_xN$ wherein $x \geq 0.4$ and M is titanium, chromium or zirconium, wherein at least a portion of the refractory layer is deposited at a bias of less than −40 V and hexagonal phase is limited in the refractory layer to 0-35 weight percent by depositing the refractory layer with a cathodic arc apparatus including at least one anode having an annular extension.

These and other embodiments are described in greater detail in the detailed description which follows.

BRIEF DESCRIPTION OF THE DRAWINGS

FIG. 9 illustrates non-limiting reference examples of PVD coating flaking for determining critical load ($L_c$) according to embodiments described herein.

DETAILED DESCRIPTION

Figure 1:
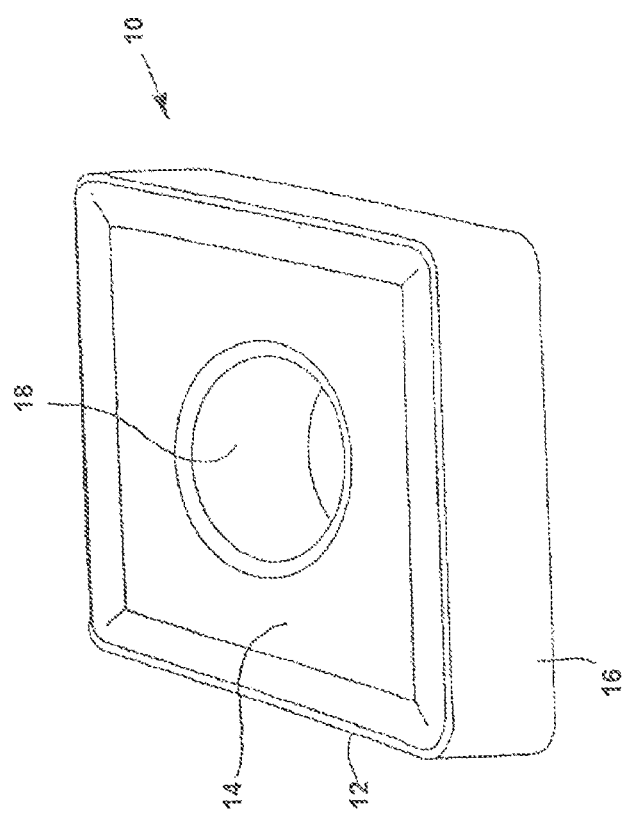
FIG. 1 illustrates a cutting tool substrate according to one embodiment described herein.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

I. Coated Cutting Tools

In one aspect, a coated cutting tool described herein comprises a substrate and a refractory layer deposited by PVD adhered to the substrate, the refractory layer comprising $M_{1-x}Al_xN$ wherein $x \geq 0.4$ and M is titanium, chromium or zirconium, the refractory layer having a thickness greater than 5 m, hardness of at least 25 GPa and residual compressive stress less than 2.5 GPa. In some embodiments, $x \geq 0.55$ or $\geq 0.6$. Further, the refractory layer can have hexagonal phase content greater than 15 weight percent and up to 35 weight percent.

In another aspect, a coated cutting tool comprises a substrate and a coating comprising a refractory layer deposited by physical vapor deposition adhered to the substrate, the refractory layer comprising $M_{1-x}Al_xN$ wherein $x \geq 0.68$ and M is titanium, chromium or zirconium, the refractory layer including a cubic crystalline phase and having hardness of at least 25 GPa.

Turning now to specific components, coated cutting tools described herein comprise a substrate. A coated cutting tool can comprise any substrate not inconsistent with the objectives of the present invention. A substrate, in some embodiments, is an end mill, drill or indexable cutting insert. Indexable cutting inserts can have any desired ANSI standard geometry for milling or turning applications. Substrates of coated cutting tools described herein can be formed of cemented carbide, carbide, ceramic, cermet or steel. A cemented carbide substrate, in some embodiments, comprises tungsten carbide (WC). WC can be present in a cutting tool substrate in an amount of at least about 80 weight percent or in an amount of at least about 85 weight percent. Additionally, metallic binder of cemented carbide can comprise cobalt or cobalt alloy. Cobalt, for example, can be present in a cemented carbide substrate in an amount ranging from 3 weight percent to 15 weight percent. In some embodiments, cobalt is present in a cemented carbide substrate in an amount ranging from 5-12 weight percent or from 6-10 weight percent. Further, a cemented carbide substrate may exhibit a zone of binder enrichment beginning at and extending inwardly from the surface of the substrate.

Cemented carbide cutting tool substrates can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with WC of the substrate. In such embodiments, the substrate can comprise one or more solid solution carbides in an amount ranging from 0.1-5 weight percent. Additionally, a cemented carbide substrate can comprise nitrogen.

A cutting tool substrate can comprise one or more cutting edges formed at the juncture of a rake face and flank face(s) of the substrate. FIG. 1 illustrates a cutting tool substrate according to one embodiment described herein. As illustrated in FIG. 1, the substrate (10) has cutting edges (12) formed at junctions of the substrate rake face (14) and flank faces (16). The substrate (10) also comprises an aperture (18) for securing the substrate (10) to a tool holder.

In addition to cutting tools, substrates can comprise wear parts of varying construction and application.

As described herein, a coating comprising a refractory layer deposited by PVD is adhered to the substrate, the refractory layer comprising $M_{1-x}Al_xN$ wherein $x \geq 0.4$ and M is titanium, chromium or zirconium, the refractory layer having a thickness greater than 5 μm, hardness of at least 25 GPa and residual compressive stress less than 2.5 GPa. Alternatively, a coating comprising a refractory layer deposited by PVD is adhered to the substrate, the refractory layer comprising $M_{1-x}Al_xN$ wherein $x \geq 0.68$ and M is titanium, chromium or zirconium, the refractory layer including a cubic crystalline phase and hardness of at least 25 GPa. In some embodiments, x of a $M_{1-x}Al_xN$ refractory layer described herein has a value selected from Table I.

TABLE I

Al Content of $M_{1-x}Al_xN$ Nanolayer (at. %)

Value of x in $M_{1-x}Al_xN$

≥0.4
≥0.5
≥0.55
≥0.6
≥0.64
≥0.68
≥0.69
≥0.7
≥0.75
0.6-0.85
0.65-0.8
0.7-0.8
0.7-0.85

With a value of x selected from Table I, the refractory layer, in some embodiments, can exhibit hexagonal phase in an amount up to 35 weight percent. For example, the refractory layer can include hexagonal phase in an amount greater than 3 weight percent and up to 30 weight percent for x≥0.64 or x≥0.69. In some embodiments, the refractory layer has hexagonal phase content according to Table II.

TABLE II

Hexagonal Phase Content of Refractory Layer

Refractory Layer Hexagonal Phase (wt. %)

0-35
3-30
20-35
25-35
20-30
1-10
1-5

Additionally, in some embodiments, the refractory layer can exhibit a hexagonal content in excess of 35 weight percent. Further, a $M_{1-x}Al_xN$ refractory layer described herein includes a cubic crystalline phase. In some embodiments, the cubic crystalline phase is the sole crystalline phase of the $M_{1-x}Al_xN$ refractory layer. In embodiments wherein hexagonal phase is present in the $M_{1-x}Al_xN$ refractory layer, cubic phase can constitute the balance of crystalline $M_{1-x}Al_xN$ in the refractory layer. Cubic phase $M_{1-x}Al_xN$ is generally desirable as it maintains high hardness and high temperature oxidation resistance of the refractory layer.

Phase determination, including hexagonal phase determination, of refractory coatings described herein is determined using x-ray diffraction (XRD) techniques and the Rietveld refinement method, which is a full fit method. The measured specimen profile and a calculated profile are compared. By variation of several parameters known to one of skill in the art, the difference between the two profiles is minimized. All phases present in a coating layer under analysis are accounted for in order to conduct a proper Rietveld refinement.

A cutting tool comprising a refractory coating described herein can be analyzed according to XRD using a grazing incidence technique requiring a flat surface. The cutting tool rake face or flank face can be analyzed depending on cutting tool geometry. XRD analysis of coatings described herein was completed using a parallel beam optics system fitted with a copper x-ray tube. The operating parameters were 45 KV and 40 MA. Typical optics for grazing incidence analysis included an x-ray mirror with 1/16 degree antiscatter slit and a 0.04 radian soller slit. Receiving optics included a flat graphite monochromator, parallel plate collimator and a sealed proportional counter. X-ray diffraction data was collected at a grazing incidence angle selected to maximize coating peak intensity and eliminate interference peaks from the substrate. Counting times and scan rate were selected to provide optimal data for the Rietveld analysis. Prior to collection of the grazing incidence data, the specimen height was set using x-ray beam splitting.

A background profile was fitted and peak search was performed on the specimen data to identify all peak positions and peak intensities. The peak position and intensity data was used to identify the crystal phase composition of the specimen coating using any of the commercially available crystal phase databases.

Crystal structure data was input for each of the crystalline phases present in the specimen.

Typical Rietveld refinement parameters settings are:
  Background calculation method: Polynomial
  Sample Geometry Flat Plate
  Linear Absorption Coefficient: Calculated from average specimen composition
  Weighting Scheme Against Iobs
  Profile Function: Pseudo-Voigt
  Profile Base Width: Chosen per specimen
  Least Squares Type: Newton-Raphson
  Polarization Coefficient: 1.0

The Rietveld refinement typically includes:
  Specimen Displacement: shift of specimen from x-ray alignment
  Background profile selected to best describe the background profile of the diffraction data
  Scale Function: scale function of each phase
  B overall: displacement parameter applied to all atoms in phase
  Cell parameters: a, b, c and alpha, beta, and gamma
  W parameter: describes peak FWHM
  Any additional parameter to achieve an acceptable "Weighted R Profile"

All Rietveld phase analysis results are reported in weight percent values.

The refractory layer comprising $M_{1-x}Al_xN$ described herein has hardness of at least 25 GPa. Hardness values are determined according to ISO 14577 with a Vickers indenter at an indentation depth of 0.25 μm. In some embodiments, a refractory layer having a construction described herein, including an x value selected from Table I and hexagonal phase content selected from Table II, has hardness according to Table III.

TABLE III

Refractory Layer Hardness (GPa)

Hardness, GPa

≥25
≥27
≥28
25-35
25-30
26-32
27-35
28-35
30-35

In addition to hardness, the refractory layer comprising $M_{1-x}Al_xN$ can have any thickness not inconsistent with the objectives of the present invention. The refractory layer, for example, can have a thickness of 1 µm to 10 µm or 2 µm to 8 µm. In some embodiments, a refractory layer comprising $M_{1-x}Al_xN$ has a thickness greater than 5 µm. For example, a refractory layer having a construction described herein, including an x value selected from Table I, hexagonal phase content selected from Table II and hardness selected from to Table III, can have a thickness selected from Table IV.

TABLE IV

Refractory Layer Thickness (µm)

| Thickness µm |
|---|
| 1-3 |
| 1-5 |
| ≥5 |
| ≥6 |
| ≥7 |
| ≥8 |
| ≥9 |
| ≥10 |
| 6-30 |
| 8-20 |
| 9-15 |

Refractory layer thicknesses described herein were measured on a flank surface of the cutting tool.

As described further herein, refractory layers comprising $M_{1-x}Al_xN$, in some embodiments, are operable to have thickness values selected from Table IV while demonstrating residual compressive stress less than 2.5 GPa. In some embodiments, for example, the refractory layer comprising $M_{1-x}Al_xN$ can have a residual compressive stress according to Table V and a thickness in excess of 5 µm.

TABLE V

Refractory Layer Residual Compressive Stress

| Residual Compressive Stress, GPa |
|---|
| ≤2.2 |
| ≤2.0 |
| ≤1.5 |
| ≤1.0 |
| 0.5 to 2.5 |
| 0.8 to 2.0 |
| 1.0 to 1.5 |

In the absence of a specific designation as being compressive, residual stress values described herein can be assigned a negative value to indicate the residual stress is compressive. As is understood by one of skill in the art, residual stress, in the absence of a specific designation, is assigned positive values to indicate tensile stress and negative values to indicate compressive stress.

For refractory layers comprising $M_{1-x}Al_xN$ described herein, a modified $\text{Sin}^2 \psi$ method was used employing Seemann-Bohlin (S-B) focusing geometry for determining residual stress and shear stress. See V. Valvoda, R. Kuzel, R. Cerny, D. S. Rafaja, J. Musil, C. Kadlec, A. J. Perry, *Thin Solid Films* 193/194 (1990) 401. According to this method, interplanar spacing of all measurable diffraction peaks with different Miller (hkl) indices was determined using the grazing-incidence X-ray diffraction geometry. [Diffraction peaks of different (hkl) planes were collected in a single 2θ scan with a fixed incident-beam angle to the specimen.] Since diffraction planes produce different angles to the sample surface normal in the approach of Perry et al., sample tilting ψ is not necessary. Perry et al. provided that the angle ψ actually corresponds to the Bragg angle θ minus the grazing angle γ (ψ=θ−γ). Therefore, in a single 2θ scan, a range of ψ angles is automatically selected when a number of Bragg peaks with different Miller indices are measured at different 2θ angles. The residual stress was then derived from a plot of the lattice parameters calculated from different peaks vs. $\text{Sin}^2 \psi$.

For refractory layers comprising $M_{1-x}Al_xN$ wherein M is titanium, for example, residual stress and shear stress was determined by x-ray diffraction using the grazing incidence $\text{Sin}^2 \psi$ method with reference to multiple (hkl) reflections of the AlTiN crystalline phase. The instrument used for residual stress determination was a PANalytical Xpert Pro MRD fitted with an Eulerian cradle for specimen manipulation. The x-ray source was a copper long fine focus x-ray tube operating at 45 KV and 40 MA. The instrument was configured with parallel beam optics for the determination of the stress in the coatings. The incident optics included an x-ray mirror and 0.04 soller slit. The receiving optics included a 0.27 degree parallel plate collimator, a flat graphite monochromator and a sealed proportional counter.

The (111), (200), (220), (311), (222), (331), (420), and (422) reflections of AlTiN were selected for the measurement of the residual stress levels. The grazing incidence angle was selected to minimize the substrate reflections while insuring that entire refractory layer thickness is included in the analysis. Data collection parameters for step size and count time were adjusted for each (hkl) reflection to obtain adequate peak intensity for accurate determination of peak position.

Peak data was then corrected for Absorption and Transparency using the following equations:

Absorption Correction $$A = \left[1 - \frac{\tan(\omega - \theta)}{\tan\theta}\right] \times \left[1 - e^{\left(-\mu t \times \frac{2\sin\theta \times \cos(\omega-\theta)}{\sin^2\theta - \sin^2(\omega-\theta)}\right)}\right]$$

Transparency Correction $$\Delta 2\theta = \frac{180}{\pi} \times \frac{2\tau}{R} \times \frac{\sin(\theta)\cos(\theta)}{\sin(\omega)}$$

$$\text{with } \tau = \frac{t}{\beta} \times \frac{(1-\beta) \times e^{-\beta} - e^{-\beta}}{1 - e^{-\beta}}$$

$$\text{and } \beta = \frac{2\mu t \sin\theta \times \cos(\omega - \theta)}{\sin^2\theta - \sin^2(\omega - \theta)}$$

where:
t=thickness of layer
µ=linear absorption coefficient (cm$^{-1}$)
θ=2Theta/2 (degrees)
(ω−θ)=omega offset angle (degrees)
ψ=tilt angle (Psi stress) (degrees)
τ=information depth (microns)
R=Radius of goniometers (mm)

The peak data was corrected for Lorentz polarization using the following equation:

Polarization Correction $$LP = \frac{\cos^2 2\theta_{mon} \times \cos^2 2\theta}{\sin\theta}$$

$2\theta_{mon}$=diffraction angle of graphite monochromator

The K$\alpha_2$ peaks were removed using the Ladell model. Peak positions were refined using a modified Lorentzian shape profile function.

The refractory layer residual stress was calculated from the general equation:

$$\frac{d_{\varphi\psi} - d_0}{d_0} = S_1(\sigma_1 + \sigma_2) + \frac{1}{2}S_2\sigma_\varphi \sin^2\psi$$

where $\sigma_\varphi = \sigma_1 \cos^2\varphi + \sigma_2 \sin^2\varphi$
$d_{\varphi\psi}$=lattice constant at angle $\varphi$ and tilt $\psi$
$d_o$=strain free lattice constant
$\varphi$=rotation angle
$\psi$=specimen tilt
$\sigma_1$ & $\sigma_2$=primary stress tensors in specimen surface
$\sigma_\varphi$=stress at $\varphi$ rotation angle
$S_1$ & ½ $S_2$=X-ray elastic constants $$S_1 = \frac{-\upsilon}{E} \qquad \frac{1}{2}S_2 = \frac{1+\upsilon}{E}$$

For the present AlTiN analysis Poisson's Ratio ($\upsilon$) was set to 0.20, and the elastic modulus (E in GPa) was determined from nano-indentation analysis conducted with a Fischerscope HM2000 in accordance with ISO standard 14577 using a Vickers indenter. Indentation depth was set to 0.25 µm. Residual stress analysis by XRD can be performed in a similar manner on refractory layers comprising $Cr_{1-x}Al_xN$ and/or $Zr_{1-x}Al_xN$ by selection of multiple (hkl) reflections appropriate for these compositions, as known to one of skill in the art. Further, Poisson's Ratio ($\upsilon$) and elastic moduli (E) for layers of $Cr_{1-x}Al_xN$ and/or $Zr_{1-x}Al_xN$ can also be determined by nano-indentation analysis as described herein.

A refractory layer comprising $M_{1-x}Al_xN$ described herein can demonstrate a critical load ($L_c$) of at least 60 kgf. Critical load characterizing adhesion of the refractory layer is determined according to the following protocol. A Rockwell Hardness Tester with superficial scales is employed having a Rockwell A or C brale indenter that is free of cracks, chip, flaws and adherent surface debris. Also employed is a spot anvil (0.25 inch diameter) and flat anvil (2 inch diameter). The appropriate pre-load (10 kg) for the indenter load being applied is selected. A flat surface of the coated substrate is selected and position on the anvil below the brale indenter and elevating screw is adjusted to the required zero scale position. Indentation(s) are applied at the desired superficial load (e.g. 60, 100, 150 kgf, etc.). The elevating screw is released and the sample is laterally positioned for application of the next load. Indents are spaced to avoid interference effects or contributions from neighboring indentations. The recommended spacing distance is 3-5× the diameter of the indentation. Any debonded but still adherent refractory layer can be removed by immersing the sample in an ultrasonic bath for several minutes. Alternatively, an adhesive tape can be used to remove debonded refractory layer. The indented samples are examined for flaking and delamination along the surface perimeter of the indent under optical microscope (10×-100×). Critical load ($L_c$) is reported at the load where coating flaking and/or delamination occur beyond the diameter of the indent. FIG. 9 illustrates non-limiting reference examples of flaking of a PVD coating under the present adhesion test. A refractory layer comprising $M_{1-x}Al_xN$, in some embodiments, exhibits an $L_c$ selected from Table VI.

TABLE VI

Critical Load ($L_c$) of $M_{1-x}Al_xN$ RefractoryLayer

≥60 kgf
≥100 kgf
≥150 kgf

The refractory layer comprising $M_{1-x}Al_xN$ and having properties of Tables I-VI herein, in some embodiments, is deposited as a single continuous layer of $M_{1-x}Al_xN$. Alternatively, the refractory layer is deposited as a plurality of $M_{1-x}Al_xN$ sublayers. Further, sublayers of other refractory material can be employed in conjunction with $M_{1-x}Al_xN$ sublayers to form the refractory layer. In some embodiments, sublayers comprising one or more elements selected from the group consisting of aluminum and metallic elements of Groups IVB, VB and VIB of the Periodic Table and one or more non-metallic elements of Groups IIIA, IVA, VA and VIA of the Periodic Table are employed with the $M_{1-x}Al_xN$ sublayers to provide the refractory layer. $M_{1-x}Al_xN$ sublayers and sublayers of other refractory material can have any desired individual thicknesses such that summation of the sublayer thicknesses is greater than 5 µm. In some embodiments, a $M_{1-x}Al_xN$ sublayer and/or sublayer of other refractory material has a thickness of 50 nm to 5 µm.

Further, $M_{1-x}Al_xN$ sublayers forming the refractory layer can demonstrate variances in residual compressive stress. For example, individual $M_{1-x}Al_xN$ sublayer(s) having low residual compressive stress can be employed in conjunction with $M_{1-x}Al_xN$ sublayer(s) of higher residual compressive stress to form the refractory layer having an overall residual compressive stress of less than 2.5 GPa. Similarly, residual stress levels between $M_{1-x}Al_xN$ sublayers and sublayers of other refractory material can be varied to form the refractory layer having an overall residual compressive stress of less than 2.5 GPa. In some embodiments, $M_{1-x}Al_xN$ sublayer(s) having low residual compressive stress can be employed in conjunction with sublayer(s) of other refractory material of higher residual compressive stress, such as TiN, to form the refractory layer having an overall residual compressive stress of less than 2.5 GPa. Alternatively, sublayer(s) of other refractory material, such as TiN, can exhibit lower residual compressive stress than the $M_{1-x}Al_xN$ sublayer(s) of the refractory layer. In embodiments wherein sublayer residual compressive stress levels are varied, at least 30 vol. % of the refractory layer is formed by sublayers having residual compressive stress less than 2.5 GPa. In some embodiments, at least 40 vol. % or at least 50 vol. % of the refractory layer is formed by sublayers having residual compressive stress less than 2.5 GPa.

As set forth above in the description of the modified $Sin^2$ Ψ method for residual stress analysis of the refractory layer, the grazing incidence angle is set to minimize substrate reflections while insuring that the entire refractory layer thickness is included in the analysis. Therefore, for a refractory layer formed of $M_{1-x}Al_xN$ sublayers with optional sublayers of other refractory material, the residual compressive stress analysis takes into account residual compressive stresses of the sublayers to yield a value of less than 2.5 GPa for the refractory layer. In some embodiments, for example, $M_{1-x}Al_xN$ sublayers of low residual compressive stress are alternated with $M_{1-x}Al_xN$ sublayers of higher residual compressive stress to form the refractory layer, thereby providing residual stress gradient(s) in the refractory layer. As described herein, $M_{1-x}Al_xN$ sublayers of low residual compressive stress can also be alternated with sublayers of other refractory material of higher residual compressive stress to form the refractory layer, thereby providing residual stress gradient(s) in the refractory layer.

In addition to differing values of residual compressive stress, $M_{1-x}Al_xN$ sublayers forming the refractory layer can demonstrate differing grain sizes. For example, $M_{1-x}Al_xN$ sublayers of higher residual compressive stress can display smaller average grain size than $M_{1-x}Al_xN$ sublayers of lower residual compressive stress, thereby establishing grain size gradient(s) in the refractory layer. Grain size of a $M_{1-x}Al_xN$ sublayer can be determined in accordance with the XRD technique described below.

Moreover, $M_{1-x}Al_xN$ sublayers forming the refractory layer can have substantially the same value for x or differing values for x. For example, $M_{1-x}Al_xN$ sublayers can have substantially the same value for x selected from Table I or differing values of x selected from Table I. In having differing values, a compositional gradient of aluminum can be established in the refractory layer.

Additionally, the refractory layer can be deposited as a plurality of sublayer groups, a sublayer group comprising a cubic phase forming nanolayer and an adjacent nanolayer of the $M_{1-x}Al_xN$. A cubic phase forming nanolayer can comprise a cubic nitride, cubic carbide or cubic carbonitride of one or more metallic elements selected from the group consisting of yttrium, silicon and metallic elements of Groups IIIA, IVB, VB and VIB of the Periodic Table. In some embodiments, for example, a cubic phase forming nanolayer is selected from the group consisting of titanium nitride, titanium carbide, zirconium nitride, tantalum carbide, niobium carbide, niobium nitride, hafnium nitride, hafnium carbide, vanadium carbide, vanadium nitride, chromium nitride, aluminum titanium nitride, cubic boron nitride, aluminum chromium nitride, titanium carbonitride and aluminum titanium carbonitride. Further, in some embodiments, a cubic phase forming nanolayer displays hexagonal phase in addition to the cubic phase. A cubic phase forming nanolayer of AlTiN, AlCrN and/or AlZrN for example, can demonstrate low amounts of hexagonal phase.

Thickness of a sublayer group comprising a $M_{1-x}Al_xN$ nanolayer deposited on a cubic phase forming nanolayer can generally range from 5 nm to 50 nm. In some embodiments, a sublayer group has a thickness in the range of 10 nm to 40 nm. Thickness of an individual $M_{1-x}Al_xN$ nanolayer can range from 5 nm to 30 nm with the thickness of an individual cubic phase forming nanolayer ranging from 2 nm to 20 nm.

Further, nanolayers of $M_{1-x}Al_xN$ and cubic phase forming compositions can demonstrate grain size distributions of 1 nm to 15 nm. Grain size distributions of nanolayers described herein can be determined according to X-ray diffraction (XRD) techniques. Crystallite or grain size determination by XRD is the result of ascertaining the integral peak width and peak shape of the diffracted sample pattern. The analysis of grain size by the Rietveld method is based on the change of the parameters to determine the sample peak profile compared to a standard peak profile. The profile parameters depend on the instrument settings used for data collection and on the profile function used for refinement.

XRD analysis is completed using a grazing incidence technique and XRD instrumentation and settings described below for hexagonal phase determination. A size-strain standard is measured. NIST standard SRM 660b Line Position and Line Shape Standard for Powder Diffraction is used for this purpose. A high quality scan is obtained for the standard (e.g. ≥140 degrees 2θ) with optics tuned for resolution. The standard structure is loaded and refined. Suitable Rietveld refinement parameters are provided in the description of hexagonal phase determination below. The Rietveld refinement for crystallite size depends on the profile function used to identify the peaks and typically includes:

| | |
|---|---|
| U parameter | describes peak FWHM |
| V parameter | describes peak FWHM |
| W parameter | describes peak FWHM |
| Peak Shape 1 | describes the peak shape function parameter |
| Peak Shape 2 | describes the peak shape function parameter |
| Peak Shape 3 | describes the peak shape function parameter |

Asymmetry describes peak asymmetry for the Rietveld or Howard Model

Refinement of the standard defines the peak profile parameters strictly due to the instrument. This refinement is saved as the instrument peak broadening standard. The unknown sample data is imported into this standard refinement and then has peak profile refinement completed using the same parameters as the size standard. The results of the refinement of the peak profiles on the unknown sample determine the crystallite size.

Figure 2:
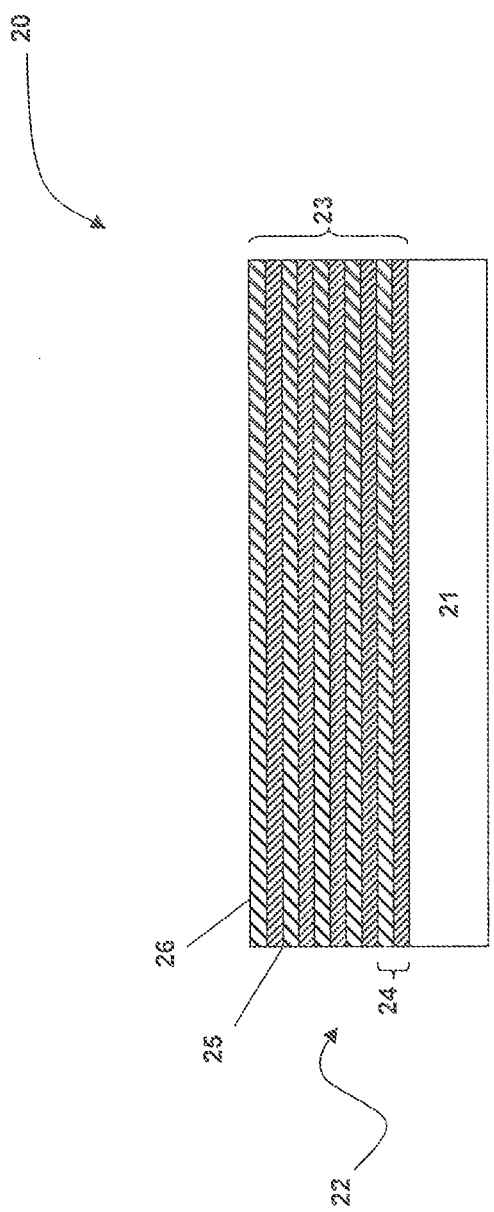
FIG. 2 is a schematic of a coated cutting tool according to one embodiment described herein.

FIG. 2 is a schematic of a coated cutting tool according to one embodiment described herein. The coated cutting tool (20) of FIG. 2 comprises a cutting tool substrate (21) and a coating (22) adhered to the substrate (21). The coating (22) is formed of a refractory layer (23) having a plurality of sublayer groups (24). A sublayer group (24) comprises a cubic phase forming nanolayer (25) and an adjacent nanolayer of $M_{1-x}Al_xN$ (26). The sublayer groups (24) are repeated or stacked to provide the refractory layer (23) the desired thickness. Alternatively, the refractory layer (23) is formed of a single layer of $M_{1-x}Al_xN$ not comprising sublayer groups.

Figure 10:
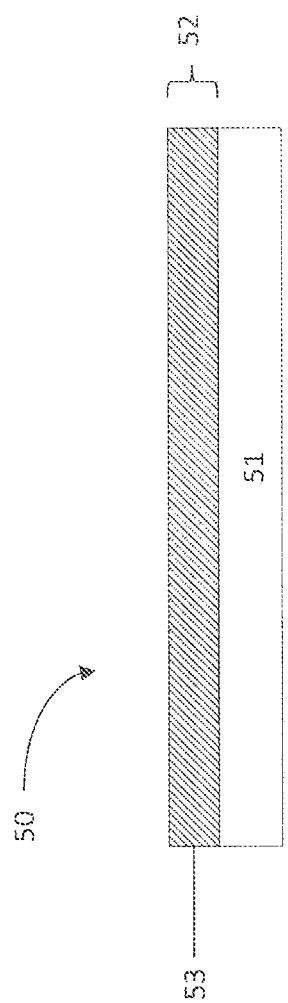
FIG. 10 is a schematic of a coated cutting tool according to one embodiment described herein.

FIG. 10 is a schematic of a coated cutting tool according to one embodiment described herein. The coated cutting tool (50) of FIG. 10 comprises a cutting tool substrate (51) and a coating (52) adhered to the substrate (50). The coating is formed of a single, monolithic refractory layer (53) of $M_{1-x}Al_xN$, wherein x is selected from Table I herein. Further, the $M_{1-x}Al_xN$ refractory layer (53) can have any combination of properties selected from Tables II-VI herein. In some embodiments, for example, the $M_{1-x}Al_xN$ refractory layer (53) has a value of x≥0.68 or ≥0.69 and a hardness of at least 25 GPa.

The refractory layer comprising $M_{1-x}Al_xN$ can be adhered directly to the substrate as illustrated in FIGS. 2 and 10. Alternatively, the refractory layer can be adhered to the substrate by one or more intermediate refractory layers. Intermediate refractory layer(s) of the coating can comprise one or more metallic elements selected from the group consisting of aluminum and metallic elements of Groups IVB, VB and VIB of the Periodic Table and one or more non-metallic elements selected from the group consisting of nonmetallic elements of Groups IIIA, IVA, VA and VIA of the Periodic Table. For example, in some embodiments, one or more intermediate layers of TiN, AlTiN, TiC, TiCN or $Al_2O_3$ can be positioned between the cutting tool substrate and the refractory layer. Intermediate layer(s) can have any desired thickness not inconsistent with the objectives of the present invention. In some embodiments, an intermediate layer has a thickness in the range of 100 nm to 5 μm.

Moreover, the coating can further comprise one or more outer refractory layers over the refractory layer comprising $M_{1-x}Al_xN$. Outer refractory layer(s) of the coating can comprise one or more metallic elements selected from the group consisting of aluminum and metallic elements of Groups IVB, VB and VIB of the Periodic Table and one or more non-metallic elements selected from the group consisting of nonmetallic elements of Groups IIIA, IVA, VA and VIA of the Periodic Table. For example, in some embodiments, one or more outer refractory layers of TiN, AlTiN, TiC, TiCN or $Al_2O_3$ can be positioned over the refractory layer of $M_{1-x}Al_xN$. Outer refractory layer(s) can have any desired thickness not inconsistent with the objectives of the present invention. In some embodiments, an outer refractory layer has a thickness in the range of 100 nm to 5 μm.

Figure 3:
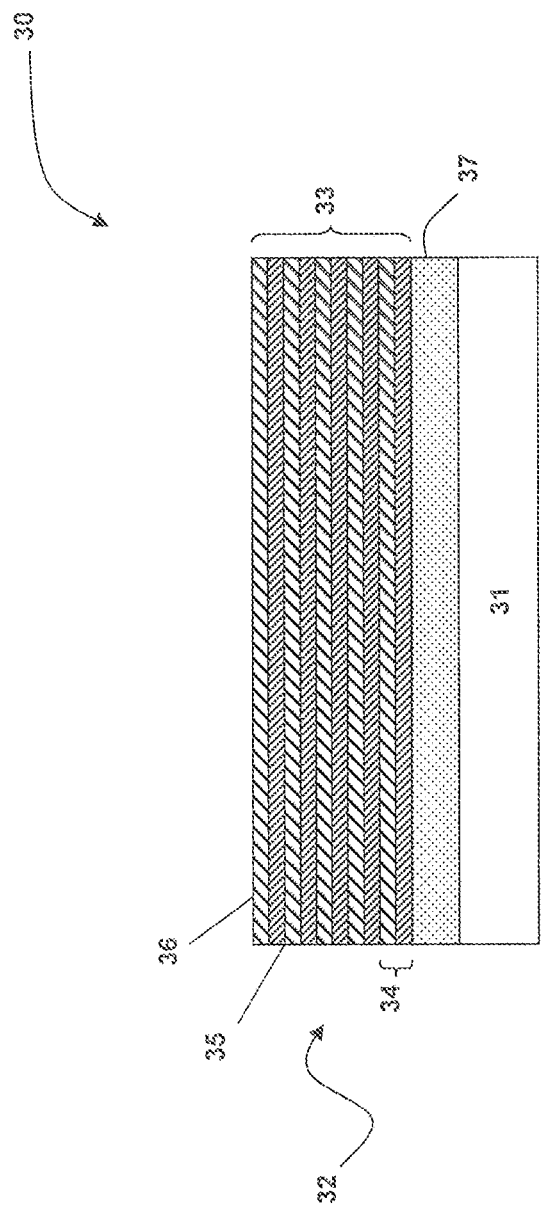
FIG. 3 is a schematic of a coated cutting tool according to one embodiment described herein.

FIG. 3 illustrates a schematic of a coated cutting tool according to one embodiment described herein. The coated cutting tool (30) of FIG. 3 comprises a cutting tool substrate (31) and a coating (32) adhered to the substrate (31). The coating (32) comprises a refractory layer (33) having a plurality of sublayer groups (34). As in FIG. 2, a sublayer group (34) comprises a cubic phase forming nanolayer (35) and an adjacent nanolayer of $M_{1-x}Al_xN$ (36). The sublayer groups (34) are repeated or stacked to provide the refractory layer (33) the desired thickness. An intermediate layer (37) is positioned between the cutting tool substrate (31) and the refractory layer (33). In some embodiments, the intermediate layer (37) is a single layer. Alternatively, the intermediate layer (37) can adopt a multilayer structure.

II. Methods of Making Coated Cutting Tools

In another aspect, methods of making coated cutting tools are described herein. A method of making a coated cutting tool comprises providing a substrate and depositing over a surface of the cutting tool substrate by cathodic arc deposition a coating comprising a refractory layer including $M_{1-x}Al_xN$ wherein x≥0.4 and M is titanium, chromium or zirconium, the refractory layer having a thickness greater than 5 μm, a hardness of at least 25 GPa and a residual compressive stress less than 2.5 GPa.

The refractory layer comprising $M_{1-x}Al_xN$ wherein x≥0.4 and M is titanium, chromium or zirconium can have any compositional parameters, structure and/or properties described for the refractory layer in Section I hereinabove. The refractory layer of $M_{1-x}Al_xN$, for example, can have a value of x selected from Table I herein, a hexagonal phase content selected from Table II herein, hardness selected form Table III herein, thickness selected from Table IV herein and residual compressive stress selected from Table V herein.

The refractory layer can be deposited as a single continuous layer of $M_{1-x}Al_xN$. In some embodiments, for example, a single continuous layer of $M_{1-x}Al_xN$ having composition and properties selected from Tables I-V herein is deposited by cathodic arc deposition using one or more cathodes having diameter less than about 80 mm. In some embodiments, each cathode of the cathodic arc deposition apparatus has a diameter less than 80 mm. Further, composition of the cathodes having diameter less than 80 mm can be chosen to limit hexagonal phase formation in the refractory layer of $M_{1-x}Al_xN$. For example, cathode composition can be chosen to have an aluminum (Al) content greater than 0.5. In some embodiments, cathode(s) having diameter less than 80 mm and composition of $Ti_{0.33}Al_{0.67}$ are employed to limit hexagonal phase formation in the refractory layer of $M_{1-x}Al_xN$. Such as result is counterintuitive given that high Al content cathodes can facilitate hexagonal phase formation.

Alternatively, the single continuous layer of $M_{1-x}Al_xN$ can be deposited with a reduction in magnitude of one or more arc steering magnetic fields. As known to one of skill in the art, electromagnets and/or permanent magnets of various strengths can be positioned behind cathodes to steer movement of the arc spots on the cathodes. According to some embodiments described herein, reduction in magnitude of one or more arc steering magnetic fields can produce refractory layer(s) of $M_{1-x}Al_xN$ having compositional parameters and properties described in Section I above. Reduction in magnitude of one or more arc steering magnetic fields can be administered by selection of weak electromagnet(s) for positioning behind cathode(s) of the deposition apparatus. For example, when using INNOVA cathodic arc deposition apparatus from OC Oerlikon Balzers AG, a reduction in arc steering magnetic field can be achieved by positioning a weak electromagnet (e.g. Mag 6) behind one or more cathodes of the apparatus. The weak electromagnet(s) can be run at a current of 0.1 A to 0.8 A. In some embodiments, the current of the weak electromagnet is 0.2-0.5 A. It is contemplated herein that a variety of weak electromagnet configurations are operable to provide the required reduction in magnitude of one or more arc steering fields to realize $M_{1-x}Al_xN$ refractory layers having compositions and properties described herein.

A reduction in magnitude of one or more arc steering fields can also be administered with various permanent magnet configurations. For example, magnetic disc number and/or size behind cathodes of the deposition apparatus can be reduced or otherwise altered to effectuate sufficient reduction in magnitude of one or more arc steering fields for producing refractory layer(s) described herein. It is within the purview of one of skill in the art to employ the foregoing principles when presented with cathodic arc deposition apparatus of varying construction to provide suitable reduction in magnitude of arc steering field(s).

Figure 4:
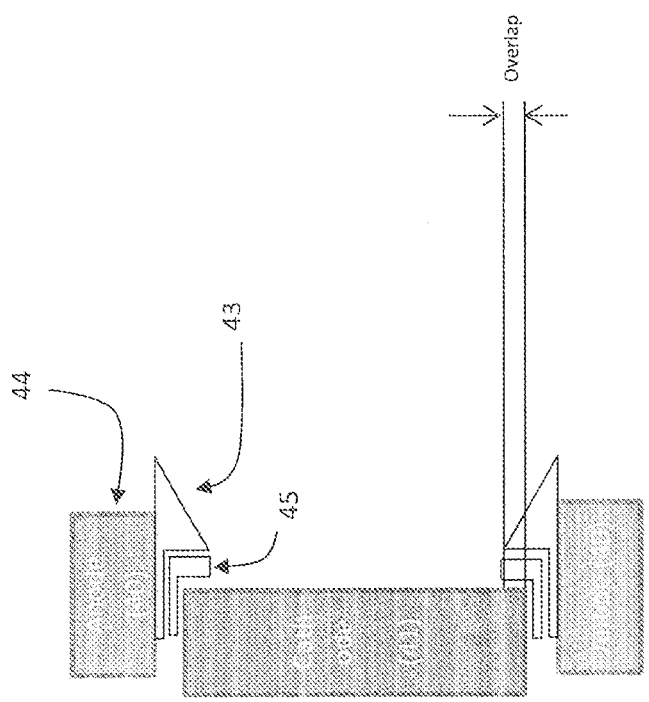
FIG. 4 is a cross-sectional schematic of an anode configuration employing an annular extension according to one embodiment described herein.

Further, the single continuous layer of $M_{1-x}Al_xN$ having composition and properties described in Section I can be deposited with a cathodic arc deposition apparatus comprising at least one anode having an annular extension. In some embodiments, each anode in the cathodic arc deposition apparatus has an annular extension. The annular extension of the anode can partially overlap with a frontal surface of the associated cathode. Additionally, a confinement ring can be positioned between the cathode and anodic annular extension. FIG. 4 is a cross-sectional schematic of an anode configuration employing an annular extension according to one embodiment described herein. As illustrated in FIG. 4, the anode (40) encircles the cathode (41) in the cathodic arc construction. The annular extension (43) projects above the frontal surface (44) of the anode (40). A confinement ring (45) is positioned between the annular extension (43) and the cathode (41).

The refractory layer can also be deposited as a plurality of $M_{1-x}Al_xN$ sublayers. Thickness and residual compressive stress of the individual $M_{1-x}Al_xN$ sublayers can be controlled by adjusting target evaporation rates, bias voltages and/or other PVD parameters.

As described herein, the refractory layer can also be deposited as a plurality of sublayer groups, a sublayer group comprising a cubic phase forming nanolayer and an adjacent nanolayer of the $M_{1-x}Al_xN$. Compositional parameters of suitable cubic phase forming nanolayers are described in Section I herein. Further, cubic phase forming nanolayers and nanolayers of $M_{1-x}Al_xN$ can demonstrate thicknesses and grain size distributions provided in Section I. Thickness of cubic phase forming nanolayers and $M_{1-x}Al_xN$ nanolayers can be controlled by adjusting target evaporation rates among other PVD parameters.

Bias voltages employed during cathodic arc deposition of the $M_{1-x}Al_xN$ refractory layer can generally range from −20V to −80 V. As described herein, at least a portion of the refractory layer comprising $M_{1-x}Al_xN$ can be deposited at a bias of less than −40 V. For example, the bias can be in the range of −20 V to less than −40 V. In some embodiments, the entire refractory layer is deposited at a bias of less than −40V. As further discussed in the Examples presented herein, it has been surprisingly found that use of cathode(s) having diameter less than 80 mm, use of anodes having an annular extension and/or reducing magnitude of one or more arc steering magnetic fields can limit hexagonal phase formation in the refractory layer formed of $M_{1-x}Al_xN$ to 0-35 weight percent at deposition bias voltages less −40V. Similarly, deposition of the refractory layer comprising $M_{1-x}Al_xN$ as a plurality of sublayer groups, including cubic phase forming nanolayers, can also limit hexagonal phase formation to 0-35 weight percent at bias voltages less than −40 V. In some embodiments, the foregoing cathodic arc deposition methods limit hexagonal phase formation to greater than 15 weight percent and up to 35 weight percent at bias voltages less than −40 V. The ability to limit hexagonal phase formation permits the deposited refractory layer comprising $M_{1-x}Al_xN$ to maintain desirable hardness. Further, bias voltages less than −40 V can limit excessive residual compressive stress in the refractory layer of $M_{1-x}Al_xN$. Therefore, refractory layers comprising $M_{1-x}Al_xN$ having desirable hardness can be deposited at thicknesses not previously realized. When coupled with values for x≥0.4, refractory layers comprising $M_{1-x}Al_xN$ can also demonstrate desirable oxidation resistance in high temperature cutting applications.

In another embodiment, a method of making a coated cutting tool described herein comprises providing a cutting tool substrate and depositing a coating over a surface of the substrate, the coating comprising a refractory layer including $M_{1-x}Al_xN$ wherein x≥0.64 and M is titanium, chromium or zirconium, the refractory layer having hardness of at least 25 GPa, wherein the refractory layer is deposited with a cathodic arc deposition apparatus comprising at least one anode having an annular extension. In some embodiments, each anode in the cathodic arc deposition apparatus has an annular extension. The annular extension of the anode can partially overlap with a frontal surface of the associated cathode. Additionally, a confinement ring can be positioned between the cathode and anodic annular extension. For example, in some embodiments, an anode configuration having an annular extension is illustrated in FIG. 4 herein.

Additionally, the cathodic arc deposition apparatus of methods described herein can employ cathode(s) having increased aluminum content. In some embodiments, for example, one or more cathodes of the cathodic arc deposition apparatus have a construction selected from Table VII.

TABLE VII

| Cathode Construction |
|---|
| $Al_{70}Ti_{30}$ |
| $Al_{73}Ti_{27}$ |
| $Al_{75}Ti_{25}$ |
| $Al_{80}Ti_{20}$ |

For example, cathodes of Table VII, for example, can be used in conjunction with an annular extension when depositing the refractory layer. In another example, cathodes of Table VII can be employed when the refractory layer is deposited as a plurality of sublayer groups. As described herein, a sublayer group comprises a cubic phase forming nanolayer and an adjacent nanolayer of the $M_{1-x}Al_xN$. Compositional parameters of suitable cubic phase forming nanolayers are described in Section I herein. Further, cubic phase forming nanolayers and nanolayers of $M_{1-x}Al_xN$ can demonstrate thicknesses and grain size distributions provided in Section I. Thickness of cubic phase forming nanolayers and $M_{1-x}Al_xN$ nanolayers can be controlled by adjusting target evaporation rates among other PVD parameters.

Bias voltages for the cathodic arc deposition apparatus employing at least one anode having an annular extension can generally range from −40V to −80V. In some embodiments, bias voltage is set to −40V, −60V or −80V. Additionally, the bias voltage can be varied in the range of −40V to −80V during deposition of the $M_{1-x}Al_xN$ refractory layer.

The refractory layer of $M_{1-x}Al_xN$ deposited by a cathodic arc deposition apparatus comprising at least one anode having an annular extension can have any construction and properties described in Section I herein, including any combination of properties listed in Tables I-VI. In some embodiments, for example, the $M_{1-x}Al_xN$ refractory layer has a value of x≥0.68, x≥0.69 or ≥0.7 and hardness of at least 25 GPa or at least 27 GPa.

These and other embodiments are further illustrated in the following non-limiting examples.

Example 1

Coated Cutting Tool

A cutting tool was coated with a refractory layer formed of a plurality of sublayer groups, each sublayer group comprising a cubic phase forming nanolayer of TiN and an adjacent nanolayer of $M_{1-x}Al_xN$, wherein M was titanium and x≥0.6. The refractory layer was deposited by cathodic arc evaporation on a cemented carbide (WC-6 wt. % Co) indexable insert substrate [ANSI standard geometry CNGP433] at a substrate temperature of 550-600° C., biasing voltage −20V, nitrogen partial pressure of 4.0-4.5 Pa and argon partial pressure of 0.5-1.0 Pa. INNOVA PVD apparatus from OC Oerlikon Balzers AG was employed for the coating deposition. Cubic phase forming nanolayers of TiN and nanolayers of $Ti_{1-x}Al_xN$ (x≥0.6) were deposited in alternating succession using cathode constructions of Table VIII to provide the refractory layer.

TABLE VIII

| | Cathode Constructions | |
|---|---|---|
| Example | Cubic Phase Forming Nanolayer Cathode | $Ti_{1-x}Al_xN$ Nanolayer Cathode |
| 1 | Ti | $Ti_{0.33}Al_{0.67}$ |

Properties of the resulting refractory layer are provided in Table IX. Hexagonal phase content, residual compressive stress and hardness of the refractory layer were determined according to their respective techniques described in Section I herein.

TABLE IX

| | Refractory Layer Properties | | | |
|---|---|---|---|---|
| Example | Hardness (GPa) | Residual Compressive Stress (MPa) | Hexagonal Phase (wt. %) | Refractory Layer Thickness (μm) |
| 1 | 28.7 | 1950 | 32.7 | 7.1 |

Figure 5:
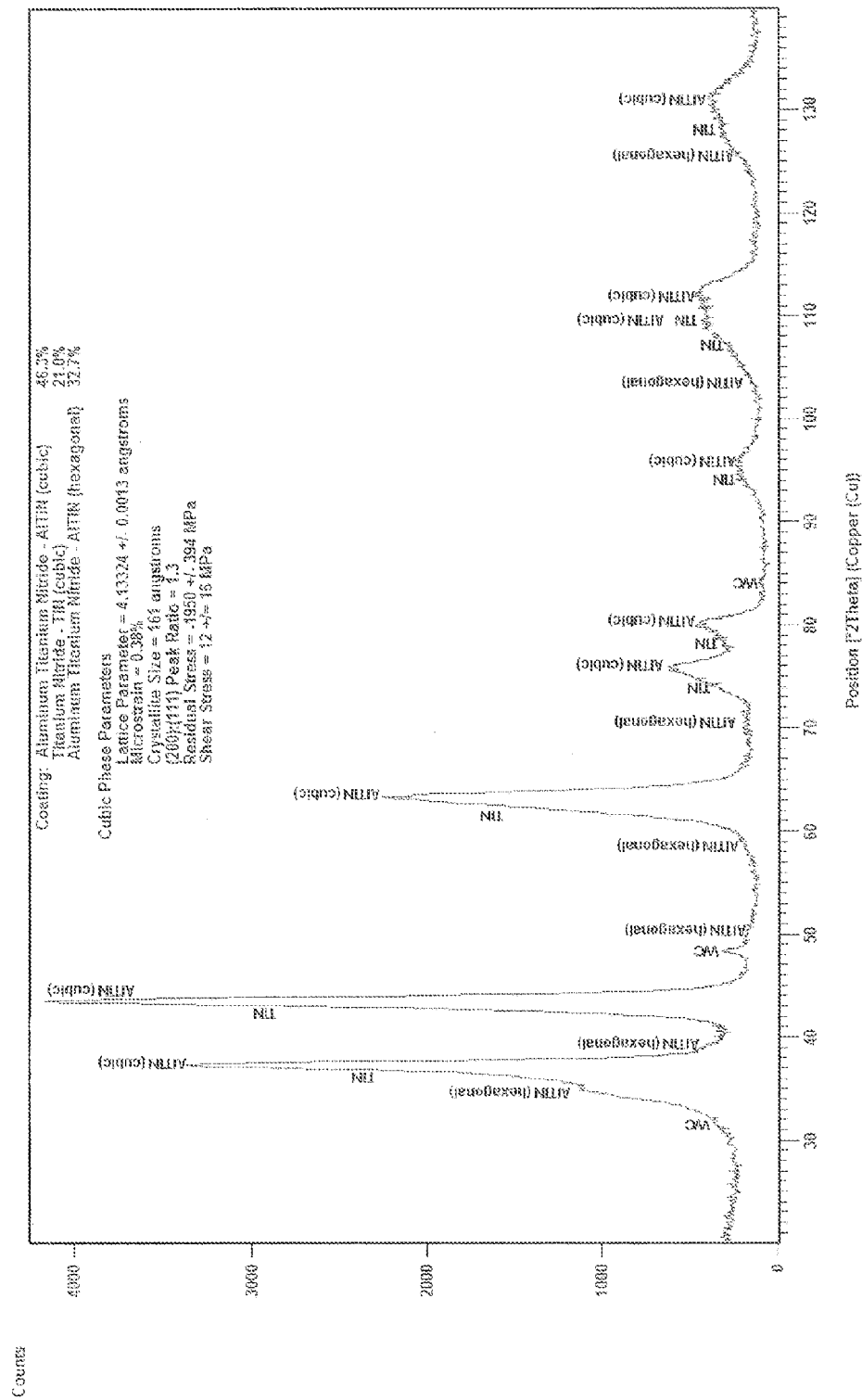
FIG. 5 is an X-ray diffractogram of a refractory coating according to one embodiment described herein.

As provided in Table IX, the refractory layer demonstrated high hardness, low residual compressive stress and high thickness. Further, FIG. 5 is an X-ray diffractogram of the refractory coating of Example 1. As illustrated in the diffractogram, TiAlN of the refractory layer was present in cubic and hexagonal form.

Example 2

Coated Cutting Tool

A coated cutting tool was made in accordance with Example 1, the differences being the bias voltage was increased to −45 V and the cemented carbide substrate geometry was ANSI standard geometry CNGP432. Properties of the resulting refractory layer are provided in Table X. Hexagonal phase content, residual compressive stress and hardness of the refractory layer were determined according to their respective techniques described in Section I herein.

TABLE X

Refractory Layer Properties

| Example | Hardness (GPa) | Residual Compressive Stress (MPa) | Hexagonal Phase (wt. %) | Refractory Layer Thickness (μm) |
|---|---|---|---|---|
| 2 | 31.0 | 1081 | 32.2 | 6.3 |

Figure 6:
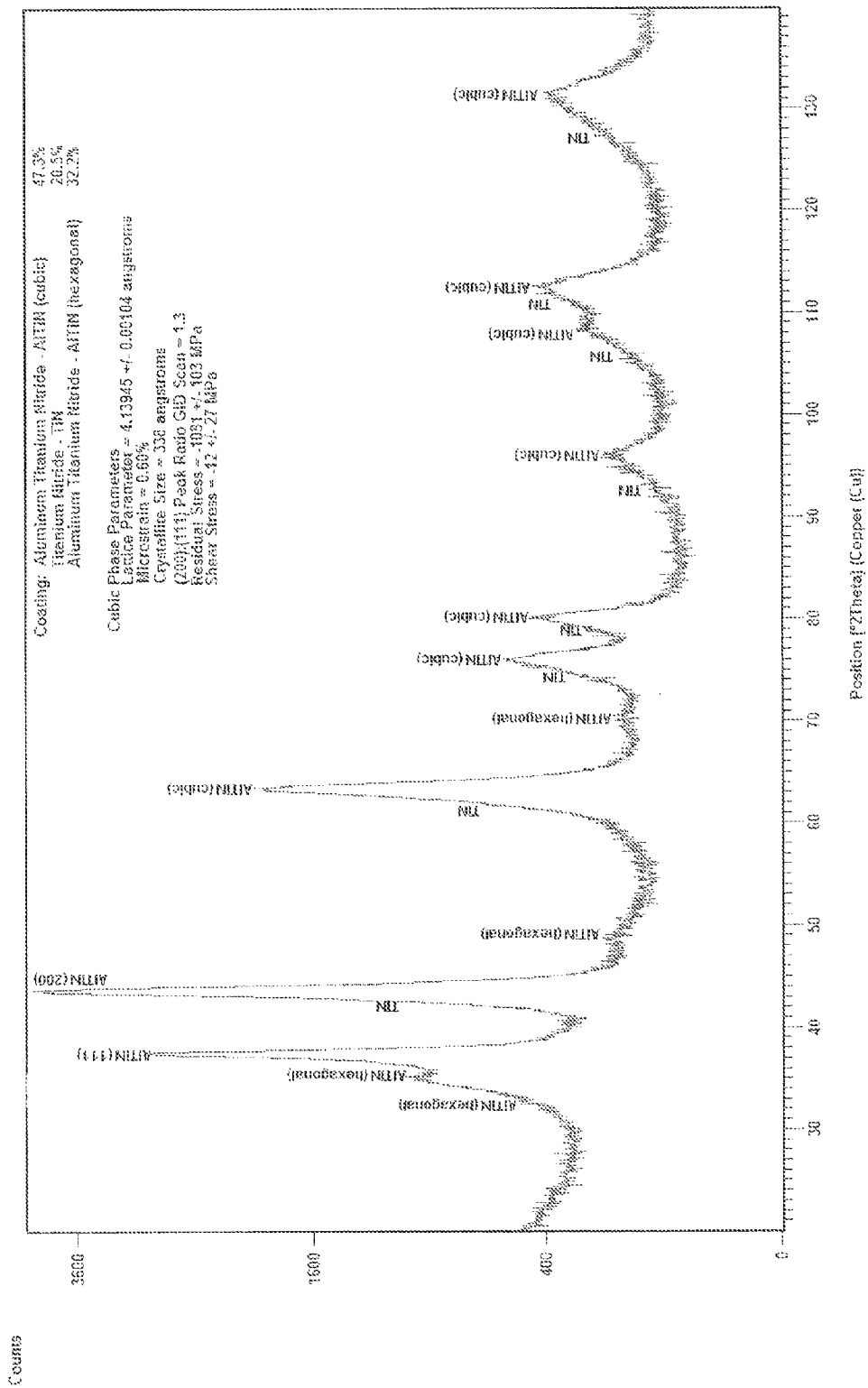
FIG. 6 is an X-ray diffractogram of a refractory coating according to one embodiment described herein.

Similar to Example 1, the coated cutting tool of Example 2 demonstrated high hardness, low residual compressive stress and high thickness. FIG. 6 is an X-ray diffractogram of the refractory coating of Example 2.

Example 3

Coated Cutting Tool

A cutting tool was coated with a single, monolithic refractory layer of $Ti_{1-x}Al_xN$ (x>0.6). The $Ti_{1-x}Al_xN$ refractory layer was deposited by cathodic arc deposition on a cemented carbide (WC-6 wt. % Co) indexable insert substrate [ANSI standard geometry SNG433] at a substrate temperature of 550-600° C., biasing voltage −30V, nitrogen partial pressure of 4.0-4.5 Pa and argon partial pressure of 0.5-1.0 Pa. INNOVA cathodic arc apparatus from OC Oerlikon Balzers AG was employed for the refractory layer deposition. Cathode composition was $Ti_{0.33}Al_{0.67}$ and anodes of the apparatus employed annular extensions. The INNOVA cathodic arc apparatus, for example, was run in the Advanced Plasma Optimizer (APO) configuration incorporating annular extensions for the anodes therein. Properties of the resulting refractory layer are provided in Table XI. Hexagonal phase content, residual compressive stress and hardness of the refractory layer were determined according to their respective techniques described in Section I herein.

TABLE XI

Refractory Layer Properties

| Example | Hardness (GPa) | Residual Compressive Stress (MPa) | Hexagonal Phase (wt. %) | Refractory Layer Thickness (μm) |
|---|---|---|---|---|
| 3 | 29.4 | 2053 | 0 | 8.1 |

Figure 7:
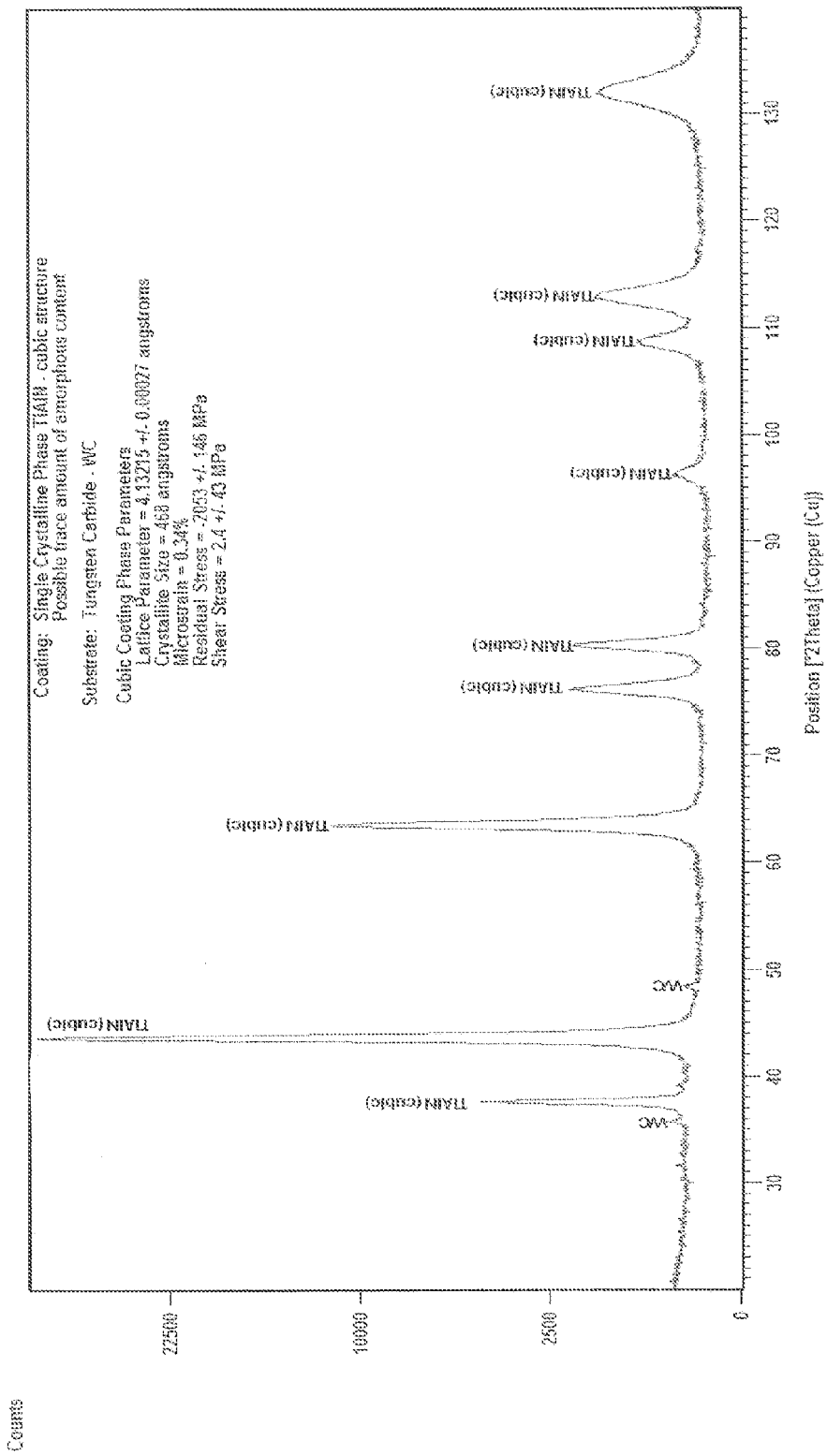
FIG. 7 is an X-ray diffractogram of a refractory coating according to one embodiment described herein.

As provided in Table XI, the refractory layer demonstrated high hardness, low residual compressive stress and high thickness. FIG. 7 is an X-ray diffractogram of the refractory coating of Example 3. As provided in FIG. 7, TiAlN of the refractory layer was single-phase cubic. Moreover, the TiAlN refractory layer of this Example did not employ cubic phase forming layers rendering it structurally divergent from Examples 1 and 2 herein.

Example 4

Coated Cutting Tool

A cutting tool was coated with a single, monolithic refractory layer of $Ti_{1-x}Al_xN$ (x>0.6). The $Ti_{1-x}Al_xN$ refractory layer was deposited by cathodic arc deposition on a cemented carbide (WC-6 wt. % Co) indexable insert substrate [ANSI standard geometry CNGP432] at a substrate temperature of 550-600° C., biasing voltage −30V, nitrogen partial pressure of 4.0-4.5 Pa and argon partial pressure of 0.5-1.0 Pa. INNOVA cathodic arc apparatus from OC Oerlikon Balzers AG was employed for the refractory layer deposition. Cathode composition was $Ti_{0.33}Al_{0.67}$ and weak electromagnets (e.g. Mag 6) were positioned behind the cathodes to produce arc steering magnetic fields with reduced magnitude. Current for the electromagnets was set in the range of 0.2-0.4 A.

Properties of the resulting refractory layer are provided in Table XII. Hexagonal phase content, residual compressive stress and hardness of the refractory layer were determined according to their respective techniques described in Section I herein.

TABLE XII

Refractory Layer Properties

| Example | Hardness (GPa) | Residual Compressive Stress (MPa) | Hexagonal Phase (wt. %) | Refractory Layer Thickness (μm) |
|---|---|---|---|---|
| 4 | 26.4 | 838 | 0 | 7.8 |

Figure 8:
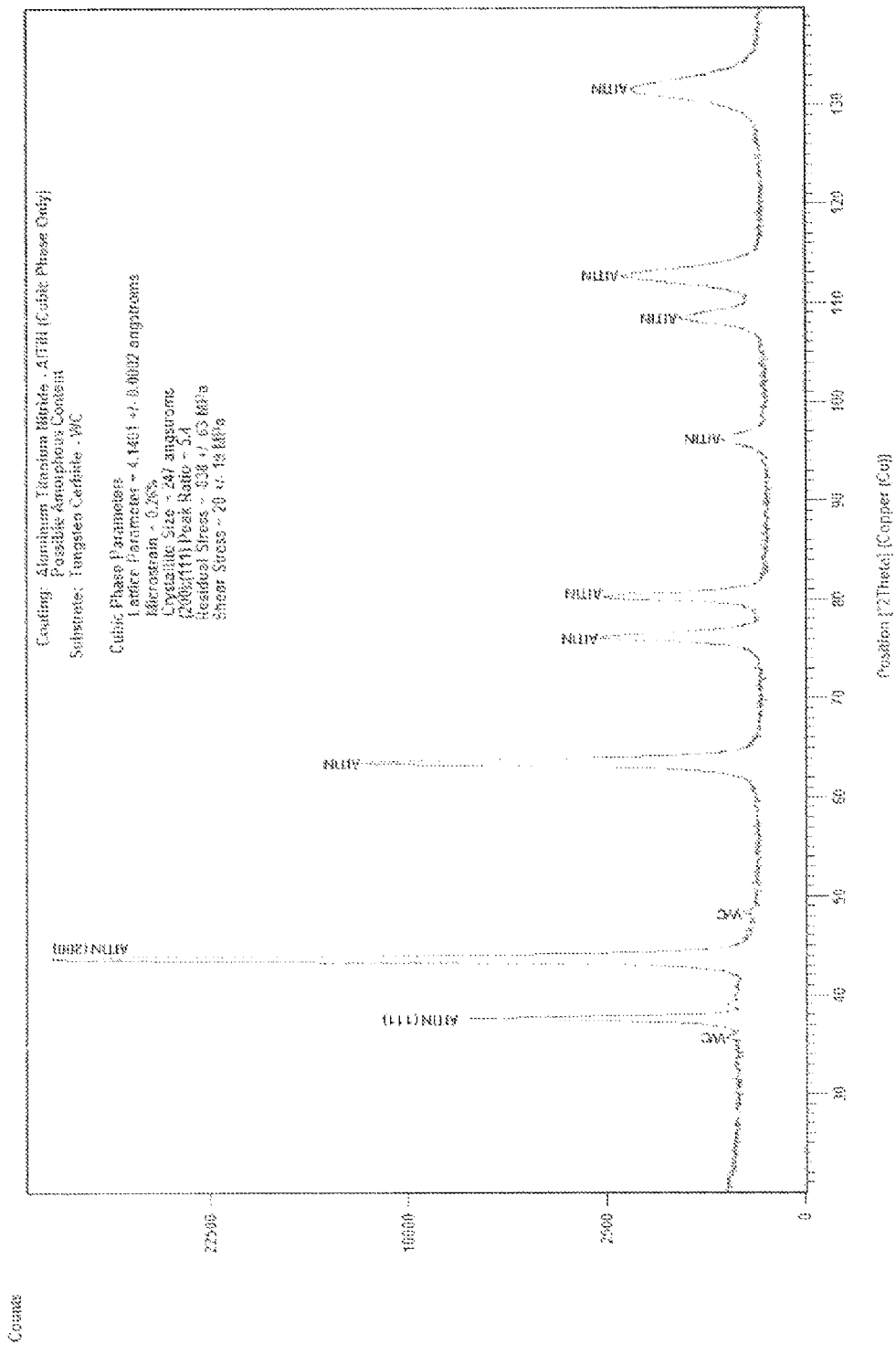
FIG. 8 is an X-ray diffractogram of a refractory coating according to one embodiment described herein.

As provided in Table XII, the refractory layer demonstrated high hardness, low residual compressive stress and high thickness. FIG. 8 is an X-ray diffractogram of the refractory coating of Example 4. As provided in FIG. 8, TiAlN of the refractory layer was single-phase cubic. Moreover, the TiAlN refractory layer of this Example did not employ cubic phase forming layers rendering it structurally divergent from Examples 1 and 2 herein.

Example 5

Coated Cutting Tools

A cutting tool (5) was coated with a single, monolithic refractory layer of $Ti_{1-x}Al_xN$ (x=0.64). The $Ti_{1-x}Al_xN$ refractory layer was deposited by cathodic arc deposition on a cemented carbide (WC-6 wt. % Co) indexable insert substrate [ANSI standard geometry SNG433] at a substrate temperature of 550-600° C., biasing voltage −40V, nitrogen partial pressure of 4.0-4.5 Pa and argon partial pressure of 0.5-1.0 Pa. INNOVA cathodic arc apparatus from OC Oerlikon Balzers AG was employed for the refractory layer deposition. Cathode composition was $Ti_{0.30}Al_{0.70}$ and anodes of the apparatus employed annular extensions. The INNOVA cathodic arc apparatus, for example, was run in the Advanced Plasma Optimizer (APO) configuration incorporating annular extensions for the anodes therein. Two additional cutting tools (6, 7) were coated according to the protocol of this Example 5, the sole difference being cutting tool (6) was produced at a bias of −60V and cutting tool (7) was produced at a bias of −80V. Properties of the resulting refractory layers are provided in Table XIII. Hardness, hexagonal phase content and critical load of the refractory layers were determined according to their respective techniques described in Section I herein.

TABLE XIII

Refractory Layer Properties

| Example 5 | Hardness (GPa) | Critical Load ($L_c$) kgf | Hexagonal Phase (wt. %) | Refractory Layer Thickness (μm) |
|---|---|---|---|---|
| 5 | 29.3 | >150 | <5 | 2.4 |
| 6 | 29.7 | >150 | <5 | 2.5 |
| 7 | 29.7 | >150 | <5 | 2.5 |

Figure 11:
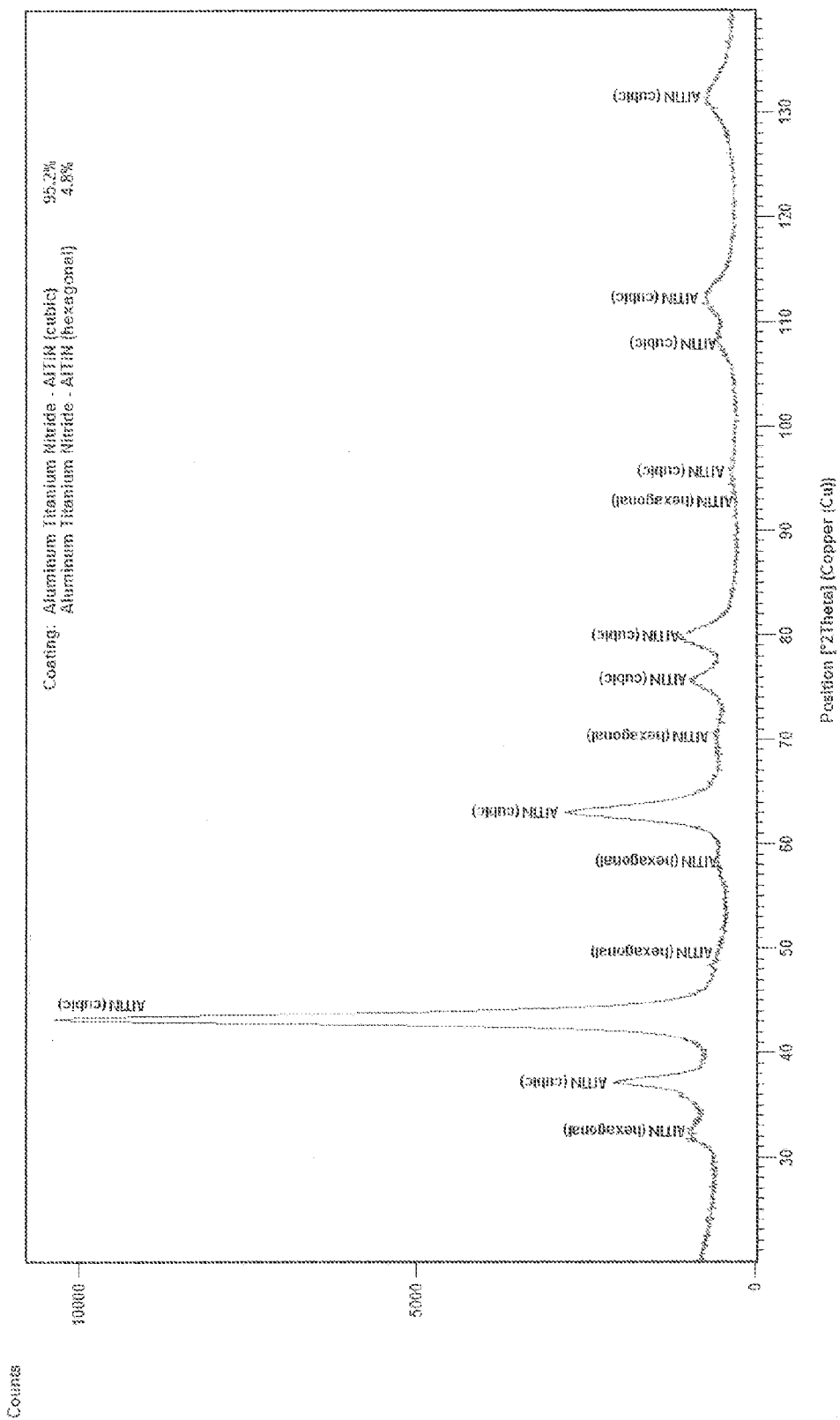
FIG. 11 is an X-ray diffractogram of a refractory coating according to one embodiment described herein.

FIG. 11 is an X-ray diffractogram of the $Ti_{1-x}Al_xN$ coating of cutting tool (1) of Example 5. As illustrated in FIG. 11, the $Ti_{1-x}Al_xN$ coating exhibited cubic and hexagonal crystalline phases.

Example 6

Coated Cutting Tools

A cutting tool (8) was coated with a single, monolithic refractory layer of $Ti_{1-x}Al_xN$ (x=0.67). The $Ti_{1-x}Al_xN$ refractory layer was deposited by cathodic arc deposition on a cemented carbide (WC-6 wt. % Co) indexable insert substrate [ANSI standard geometry SNG433] at a substrate temperature of 550-600° C., biasing voltage −40V, nitrogen partial pressure of 4.0-4.5 Pa and argon partial pressure of 0.5-1.0 Pa. INNOVA cathodic arc apparatus from OC Oerlikon Balzers AG was employed for the refractory layer deposition. Cathode composition was $Ti_{0.27}Al_{0.73}$ and anodes of the apparatus employed annular extensions. The INNOVA cathodic arc apparatus was run in the Advanced Plasma Optimizer (APO) configuration incorporating annular extensions for the anodes therein. Two additional cutting tools (9, 10) were coated according to the protocol of this Example 6, the sole difference being cutting tool (9) was produced at a bias of −60V and cutting tool (10) was produced at a bias of −80V. Properties of the resulting refractory layers are provided in Table XIV. Hardness and critical load of the refractory layers were determined according to their respective techniques described in Section I herein.

TABLE XIV

Refractory Layer Properties

| Example 6 | Hardness (GPa) | Critical Load ($L_c$) kgf | Refractory Layer Thickness (μm) |
|---|---|---|---|
| 8 | 26.0 | >150 | 2.7 |
| 9 | 27.2 | >150 | 2.5 |
| 10 | 28.8 | >150 | 2.5 |

Cubic and hexagonal phases were present in the $Ti_{0.33}Al_{0.67}N$ refractory layer of cutting tools 8-10.

Example 7

Coated Cutting Tools

A cutting tool (11) was coated with a single, monolithic refractory layer of $Ti_{1-x}Al_xN$ (x=0.7). The $Ti_{1-x}Al_xN$ refractory layer was deposited by cathodic arc deposition on a cemented carbide (WC-6 wt. % Co) indexable insert substrate [ANSI standard geometry SNG433] at a substrate temperature of 550-600° C., biasing voltage −40V, nitrogen partial pressure of 4.0-4.5 Pa and argon partial pressure of 0.5-1.0 Pa. INNOVA cathodic arc apparatus from OC Oerlikon Balzers AG was employed for the refractory layer deposition. Cathode composition was $Ti_{0.25}Al_{0.75}$ and anodes of the apparatus employed annular extensions. The INNOVA cathodic arc apparatus was run in the Advanced Plasma Optimizer (APO) configuration incorporating annular extensions for the anodes therein. Two additional cutting tools (12, 13) were coated according to the protocol of this Example 7, the sole difference being cutting tool (12) was produced at a bias of −60V and cutting tool (13) was produced at a bias of −80V. Properties of the resulting refractory layers are provided in Table XV. Hardness, critical load and hexagonal phase of the refractory layers were determined according to their respective techniques described in Section I herein.

TABLE XV

Refractory Layer Properties

| Example 7 | Hardness (GPa) | Critical Load ($L_c$) kgf | Refractory Layer Thickness (μm) | Hexagonal Phase (wt. %) |
|---|---|---|---|---|
| 11 | 25.0 | >150 | 2.6 | <30 |
| 12 | 26.9 | >150 | 2.4 | <30 |
| 13 | 26.5 | >150 | 2.8 | <30 |

The deposited $Ti_{1-x}Al_xN$ coatings exhibited less than 30 wt. % hexagonal phase with the remainder crystalline phase being cubic.

Example 8

Coated Cutting Tools

A cutting tool (14) was coated with a single, monolithic refractory layer of $Ti_{1-x}Al_xN$ (x=0.76). The $Ti_{1-x}Al_xN$ refractory layer was deposited by cathodic arc deposition on a cemented carbide (WC-6 wt. % Co) indexable insert substrate [ANSI standard geometry SNG433] at a substrate temperature of 550-600° C., biasing voltage −60V, nitrogen partial pressure of 4.0-4.5 Pa and argon partial pressure of 0.5-1.0 Pa. INNOVA cathodic arc apparatus from OC Oerlikon Balzers AG was employed for the refractory layer deposition. Cathode composition was $Ti_{0.20}Al_{0.80}$ and anodes of the apparatus employed annular extensions. The INNOVA cathodic arc apparatus was run in the Advanced Plasma Optimizer (APO) configuration incorporating annular extensions for the anodes therein. An additional cutting tool (14) was coated according to the protocol of this Example 8, the sole difference being cutting tool (14) was produced at a bias of −80V. Properties of the resulting refractory layers are provided in Table XVI. Hardness and critical load of the refractory layers were determined according to their respective techniques described in Section I herein.

TABLE XVI

| | Refractory Layer Properties | | |
|---|---|---|---|
| Example 8 | Hardness (GPa) | Critical Load ($L_c$) kgf | Refractory Layer Thickness (μm) |
| 13 | 25.4 | >150 | 2.7 |
| 14 | 26.1 | >150 | 2.7 |

The deposited $Ti_{1-x}Al_xN$ refractory layers of cutting tools (13 and 14) exhibited cubic and hexagonal crystalline phases.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A coated cutting tool comprising:
   a substrate; and
   a coating comprising a refractory layer deposited by physical vapor deposition adhered to the substrate, the refractory layer comprising $M_{1-x}Al_xN$ wherein x≥0.68 and M is titanium, chromium or zirconium, the refractory layer including a cubic crystalline phase, hardness of at least 25 GPa, thickness of 2 to 8 μm and residual compressive stress less than 2.5 GPa.

2. The coated cutting tool of claim 1, wherein x≥0.69.

3. The coated cutting tool of claim 2, having hardness of at least 27 GPa.

4. The coated cutting tool of claim 1, wherein 0.7≤x≤0.85.

5. The coated cutting tool of claim 4, wherein the refractory layer has less than 30 weight percent hexagonal phase.

6. The coated cutting tool of claim 1, wherein the refractory layer has a critical load ($L_c$) of at least 100 kg.

7. The coated cutting tool of claim 1, wherein the refractory layer has an $L_c$ of at least 150 kg.

8. The coated cutting tool of claim 1, wherein the refractory layer has less than 35 weight percent hexagonal phase.

9. The coated cutting tool of claim 1, wherein the refractory layer is adhered directly to the substrate.

10. The coated cutting tool of claim 1, wherein the refractory layer is adhered to the substrate by one or more intermediate refractory layers.

11. The coated cutting tool of claim 10, wherein the one or more intermediate refractory layers comprise one or more metallic elements selected from the group consisting of aluminum and metallic elements of Groups IVB, VB and VIB of the Periodic Table and one or more non-metallic elements of Groups IIIA, IVA, VA and VIA of the Periodic Table.

12. The coated cutting tool of claim 11, wherein the one or more intermediate refractory layers are selected from the group consisting of TiN, AlTiN, TiC, TiCN and $Al_2O_3$.

13. The coated cutting tool of claim 1, wherein the coating further comprises one or more outer refractory layers over the refractory layer.

14. The coated cutting tool of claim 13, wherein the one or more outer refractory layers comprise one or more metallic elements selected from the group consisting of aluminum and metallic elements of Groups IVB, VB and VIB of the Periodic Table and one or more non-metallic elements of Groups IIIA, IVA, VA and VIA of the Periodic Table.

15. The coated cutting tool of claim 1, wherein the substrate is formed of cemented carbide, carbide, ceramic or steel.

16. The coated cutting tool of claim 1, wherein M is titanium.

17. The coated cutting tool of claim 1 having residual compressive stress less than 1.5 GPa.

18. The coated cutting tool of claim 1, wherein the refractory layer has 3-30 weight percent hexagonal phase.

19. The coated cutting tool of claim 1, wherein the refractory layer has 20-35 weight percent hexagonal phase.

20. A coated cutting tool comprising:
    a substrate; and
    a coating comprising a refractory layer deposited by physical vapor deposition adhered to the substrate, the refractory layer comprising $M_{1-x}Al_xN$ wherein x≥0.68 and M is titanium, chromium or zirconium, the refractory layer having thickness of 1 μm to 10 μm and including a cubic crystalline phase and hardness of at least 27 GPa and residual compressive stress less than 2.5 GPa.

21. The coated cutting tool of claim 20, wherein x≥0.69.

22. The coated cutting tool of claim 20, wherein 0.7≤x≤0.85.

23. The coated cutting tool of claim 22, wherein the refractory layer has less than 30 weight percent hexagonal phase.

24. The coated cutting tool of claim 20, wherein the refractory layer has a critical load ($L_c$) of at least 100 kg.

25. The coated cutting tool of claim 20, wherein the refractory layer has a thickness of 2 to 8 μm.

26. The coated cutting tool of claim 25 having residual compressive stress less than 1.5 GPa.

27. The coated cutting tool of claim 20, wherein the refractory layer is adhered directly to the substrate.

28. The coated cutting tool of claim 20, wherein the refractory layer is adhered to the substrate by one or more intermediate refractory layers.

29. The coated cutting tool of claim 28, wherein the one or more intermediate refractory layers are selected from the group consisting of TiN, AlTiN, TiC, TiCN and $Al_2O_3$.

30. The coated cutting tool of claim 20, wherein the coating further comprises one or more outer refractory layers over the refractory layer, the one or more outer refractory layers comprising one or more metallic elements selected from the group consisting of aluminum and metallic elements of Groups IVB, VB and VIB of the Periodic Table and one or more non-metallic elements of Groups IIIA, IVA, VA and VIA of the Periodic Table.

31. The coated cutting tool of claim 20, wherein the refractory layer has 3-30 weight percent hexagonal phase.

32. The coated cutting tool of claim 20, wherein the refractory layer has 20-35 weight percent hexagonal phase.

* * * * *